(12) United States Patent
Shtein et al.

(10) Patent No.: US 7,682,660 B2
(45) Date of Patent: Mar. 23, 2010

(54) PROCESS AND APPARATUS FOR ORGANIC VAPOR JET DEPOSITION

(75) Inventors: Max Shtein, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 12/168,532

(22) Filed: Jul. 7, 2008

(65) Prior Publication Data

US 2008/0299311 A1   Dec. 4, 2008

Related U.S. Application Data

(63) Continuation of application No. 10/233,470, filed on Sep. 4, 2002, now Pat. No. 7,431,968.

(60) Provisional application No. 60/317,215, filed on Sep. 4, 2001, provisional application No. 60/316,264, filed on Sep. 4, 2001, provisional application No. 60/316,968, filed on Sep. 5, 2001, provisional application No. 60/332,090, filed on Nov. 21, 2001.

(51) Int. Cl.
*C23C 16/00* (2006.01)

(52) U.S. Cl. .................. 427/255.6; 427/255.23

(58) Field of Classification Search .......... None
See application file for complete search history.

(56) References Cited

U.S. PATENT DOCUMENTS

| | | |
|---|---|---|
| 3,930,908 A | 1/1976 | Jolly |
| 4,788,082 A | 11/1988 | Schmitt |
| 5,256,205 A | 10/1993 | Schmitt, III et al. |
| 5,356,673 A | 10/1994 | Schmitt et al. |
| 5,421,888 A | 6/1995 | Hasegawa |
| 5,554,220 A | 9/1996 | Forrest et al. |
| 5,595,606 A | 1/1997 | Fujikawa et al. |
| 5,650,197 A | 7/1997 | Halpern |
| 5,707,745 A | 1/1998 | Forrest et al. |

(Continued)

FOREIGN PATENT DOCUMENTS

EP        173 715        4/1992

(Continued)

OTHER PUBLICATIONS

Baldo, M. et al. Organic Vapor Phase Deposition, 1998, Advanced Materials, 10(18), 1505-1514.*

(Continued)

*Primary Examiner*—Timothy Meeks
*Assistant Examiner*—Kelly M Gambetta
(74) *Attorney, Agent, or Firm*—Townsend and Townsend and Crew LLP

(57) ABSTRACT

A method of fabricating an organic film is provided. A non-reactive carrier gas is used to transport an organic vapor. The organic vapor is ejected through a nozzle block onto a cooled substrate, to form a patterned organic film. A device for carrying out the method is also provided. The device includes a source of organic vapors, a source of carrier gas and a vacuum chamber. A heated nozzle block attached to the source of organic vapors and the source of carrier gas has at least one nozzle adapted to eject carrier gas and organic vapors onto a cooled substrate disposed within the vacuum chamber.

34 Claims, 14 Drawing Sheets

U.S. PATENT DOCUMENTS

| | | | |
|---|---|---|---|
| 5,720,821 | A | 2/1998 | Halpern |
| 5,759,634 | A | 6/1998 | Halpern |
| 6,037,241 | A | 3/2000 | Powell et al. |
| 6,048,630 | A | 4/2000 | Burrows et al. |
| 6,056,823 | A | 5/2000 | Sajoto et al. |
| 6,065,492 | A | 5/2000 | Bergamini |
| 6,066,357 | A | 5/2000 | Tang et al. |
| 6,165,554 | A * | 12/2000 | Halpern et al. ............ 427/248.1 |
| 6,337,102 | B1 | 1/2002 | Forrest et al. |
| 6,482,266 | B1 | 11/2002 | Matsumoto et al. |
| 6,537,607 | B1 | 3/2003 | Swanson |
| 6,572,706 | B1 | 6/2003 | Nguyen et al. |
| 6,716,656 | B2 | 4/2004 | Shtein et al. |
| 6,962,624 | B2 | 11/2005 | Jurgenesen et al. |
| 2003/0054099 | A1 | 3/2003 | Jurgensen et al. |
| 2003/0054100 | A1 | 3/2003 | Eser et al. |
| 2003/0087471 | A1 | 5/2003 | Shtein et al. |

FOREIGN PATENT DOCUMENTS

| | | |
|---|---|---|
| GB | 2 336 553 | 10/1999 |
| JP | 6-027329 | 4/1994 |
| JP | 7-258828 | 10/1995 |
| WO | WO 85/03460 | 8/1985 |
| WO | WO 99/25894 | 5/1999 |
| WO | WO 01/61071 | 8/2001 |
| WO | WO 02/27064 | 4/2002 |

OTHER PUBLICATIONS

Evaporation (deposition). http://en.wikipedia.org/wiki/Evaporation_(deposition). Accessed Jul. 28, 2009.*

Zhang et al., Jet Vapor Deposition of Nanostructure Composite Materials, Materials Res. Soc. Symp. Proc., Mater. Res. Soc. Symposium Proc. 1193, 286, pp. 385-389.

Supplementary European Search Report from EP 0 277 0461 dated Jun. 12, 2007.

Forrest et al., "Intense Second Harmonic and Long-Range Structural Ordering in Thin Films of Organic Salt Grown by Organic Vapor Phase Deposition," Appl. Phys. Lett., vol. 68, pp. 1326-1328 (1996).

Shtein et al., "Effects of Film Morphology and Gate Dielectric Surface Preparation on the Electrical Characteristics of Organic Vapor Phase Deposited Pentacene Thin-Film Transistors," Appl. Phys. Lett., vol. 81, pp. 268-270 (2002).

Shtein, et al., "Micron scale patterning of organic thin films via organic vapor phase deposition", Presentation Outline from the Mat. Res. Soc. Ann. Meeting 2001, Boston.

Shtein et al., "Micropatterning of small molecular weight organic semiconductor thin films using organic vapor phase deposition", J. Appl. Phys., vol. 93, No. 7, pp. 4005-4016, Apr. 1, 2003.

S. Krumdieck, "Kinetic Model of Low Pressure Film Deposition from Single Precursor Vapor in a Well-Mixed, Cold-Wall Reactor", Acta mater 49, 583-588.

R.B. Bird, et al., Transport Phenomena, New York, John Wiley & Sons, Inc., pp. 508-513 (1960).

S.R. Forrest, "Ultrathin Organic films grown by organic molecular beam deposited and related techniques", Chem. Rev. vol. 97, No. 6, pp. 793-1896 (Sep./Oct. 1997).

S. Wolf and R. N. Tauber, *Silicon Processing for the VLSI Era*, vol. I: *Process Technology*, pp. 73-123 (Lattice, 1986).

M. A. Baldo, et al., Organic Vapor Phase Deposition, *Adv. Mater*. 10, No. 18, pp. 1505-1514 (1998).

G. B. Stringfellow, *Organometallic Vapor-Phase Epitaxy: Theory and Practice*, pp. 55-283 (Academic, London, 1989).

G. H. Olsen, "Vapour-phase Epitaxy of GaInAsP", *GaInAsP Alloy Semiconductors*, edited by T. P. Pearsall (Wiley, New York, 1982), pp. 11-41.

P. E. Burrows, et al., "Organic Vapor Phase Deposition, a new method for the growth of organic thin films with large optical non-linearities", *J. Cryst. Growth* 156, pp. 91-98 (1995).

K. M. Vaeth, et al., "Chemical vapor deposition of poly (p-phenylene vinylene) based light emitting diodes with low turn-on voltages", *Appl. Phys. Lett.* 71(15), pp. 2091-2093 (Oct. 13, 1997).

M. A. Baldo, et al., "Low pressure organic vapor phase deposition of small molecular weight organic light emitting device structures", *Appl. Phys. Lett.* 71(21), pp. 3033-3035 (Nov. 24, 1997).

M. Shtein, et al., Material transport regimes and mechanisms for growth of molecular organic thin films using low-pressure organic vapor phase deposition, *J. Appl. Phys.* 89:2, pp. 1470-1476 (Jan. 15, 2001).

Sybil P. Parker, ed., McGraw-Hill Dictionary of Scientific and Technical Terms, Fifth Edition, p. 1516 (1994).

ASTM, Compilation of ASTM Standard Definitions, Eighth Edition, p. 380 (1994).

CRC Handbook of Chemistry and Physics, 54th edition, CRC Press, 1973, p. E-225.

Shtein et al., "Process and apparatus for organic vapor jet deposition", U.S. Appl. No. 10/233,470.

Notice of Preliminary Rejection (Office Action) was issued by the Korean Patent Office (KIPO) on Apr. 23, 2009 in the Korean Patent Application No. 2004-7003206.

* cited by examiner 1.0 Torr 0.1 Torr 0.01 Torr s = 3 μm s = 10 μm s = 20 μm t = 18 µm t = 36 µm t = 54 µm δ = 410 μm δ = 2060 μm

PROCESS AND APPARATUS FOR ORGANIC VAPOR JET DEPOSITION

CROSS-REFERENCE TO RELATED APPLICATIONS

This patent application is a continuation of U.S. application Ser. No. 10/233,470, filed Sep. 4, 2002, which claims priority benefits U.S. provisional patent applications No. 60/317,215, filed Sep. 4, 2001, 60/316,264, filed Sep. 4, 2001, 60/316,968, filed Sep. 5, 2001, and 60/332,090, filed Nov. 21, 2001. Each of these applications is incorporated by reference in their entireties. This patent application is related to simultaneously filed U.S. application Ser. No. 10/233,482, which is incorporated by reference in its entirety.

STATEMENT REGARDING GOVERNMENT RIGHTS

This invention was made with Government support under Contract No. F49620-92-5-05 24 (Princeton University), awarded by the U.S. Air Force OSR (Office of Scientific Research). The Government has certain rights in this invention.

FIELD OF THE INVENTION

The present invention is directed to a process of patterned deposition of organic materials onto substrates which utilizes the vapor transport mechanisms of organic vapor phase deposition.

BACKGROUND OF THE INVENTION

Molecular organic compounds are employed as active materials in a variety of applications, including organic light emitting diodes (OLEDs), photovoltaic cells, and thin films. Typically, these thin (~100 nm) film devices are grown by thermal evaporation in high vacuum, permitting the high degree of purity and structural control needed for reliable and efficient operation (see S. R. Forrest, *Chem. Rev.* 97, 1793 (1997)). However, control of film thickness uniformity and dopant concentrations over large areas needed for manufactured products can be difficult when using vacuum evaporation (see S. Wolf and R. N. Tauber, *Silicon Processing for the VLSI Era* (Lattice, 1986)). In addition, a considerable fraction of the evaporant coats the cold walls of the deposition chamber. Over time, inefficient use of materials results in a thick coating which can flake off, leading to particulate contamination of the system and substrate. The potential throughput for vacuum evaporated organic thin film devices is low, resulting in high production costs. Low-pressure organic vapor phase deposition (LP-OVPD) has been demonstrated recently as a superior alternative technique to vacuum thermal evaporation (VTE), in that OVPD improves control over dopant concentration of the deposited film, and is adaptable to rapid, particle-free, uniform deposition of organics on large-area substrates (see M. A. Baldo, M. Deutsch, P. E. Burrows, H. Gossenberger, M. Gerstenberg, V. S. Ban, and S. R. Forrest, *Adv. Mater.* 10, 1505 (1998)).

Organic vapor phase deposition (OVPD) is inherently different from the widely used vacuum thermal evaporation (VTE), in that it uses a carrier gas to transport organic vapors into a deposition chamber, where the molecules diffuse across a boundary layer and physisorb on the substrate. This method of film deposition is most similar to hydride vapor phase epitaxy used in the growth of III-V semiconductors (see G. B. Stringfellow, *Organometallic Vapor-Phase Epitaxy* (Academic, London, 1989); G. H. Olsen, in *GaInAsP*, edited by T. P. Pearsall (Wiley, New York, 1982)). In LP-OVPD, the organic compound is thermally evaporated and then transported in a hot-walled reactor by an inert carrier gas toward a cooled substrate where condensation occurs. Flow patterns may be engineered to achieve a substrate-selective, uniform distribution of organic vapors, resulting in a very uniform coating thickness and minimized materials waste.

Using atmospheric pressure OVPD, Burrows et al. (see P. E. Burrows, S. R. Forrest, L. S. Sapochak, J. Schwartz, P. Fenter, T. Buma, V. S. Ban, and J. L. Forrest, *J. Cryst. Growth* 156, 91 (1995)) first synthesized a nonlinear optical organic salt 4'-dimethylamino-N-methyl4-stilbazolium tosylate. In a variation on this method, Vaeth and Jensen (see K. M. Vaeth and K. Jensen, *Appl. Phys. Lett.* 71, 2091 (1997)) used nitrogen to transport vapors of an aromatic precursor, which was polymerized on the substrate to yield films of poly (s-phenylene vinylene), a light-emitting polymer. Recently, Baldo and co-workers (see M. A. Baldo, V. G. Kozlov, P. E. Burrows, S. R. Forrest, V. S. Ban, B. Koene, and M. E. Thompson, *Appl. Phys. Lett.* 71, 3033 (1997)) have demonstrated apparently the first LP-OVPD growth of a heterostructure OLED consisting of N,N-di-(3-methylphenyl)-N,N diphenyl-4,4-di-aminobiphenyl and aluminum tris(8-hydroxyquinoline) ($Alq_3$), as well as an optically pumped organic laser consisting of rhodamine 6G doped into $Alq_3$. More recently, Shtein et al. have determined the physical mechanisms controlling the growth of amorphous organic thin films by the process of LP-OVPD (see M. Shtein, H. F. Gossenberger, J. B. Benziger, and S. R. Forrest, *J. Appl. Phys.* 89:2, 1470 (2001)).

Virtually all of the organic materials used in thin film devices have sufficiently high vapor pressures to be evaporated at temperatures below 400° C. and to then be transported in the vapor phase by a carrier gas such as argon or nitrogen. This allows for positioning of evaporation sources outside of the reactor tube (as in the case of metalorganic chemical vapor deposition (see S. Wolf and R. N. Tauber, *Silicon Processing for the VLSI Era* (Lattice, 1986); G. B. Stringfellow, *Organometallic Vapor-Phase Epitaxy* (Academic, London, 1989)), spatially separating the functions of evaporation and transport, thus leading to precise control over the deposition process.

Though these examples demonstrate that OVPD has certain advantages over VTE in the deposition of organic films, especially over large substrate areas, the prior art has not addressed the special problems that arise when depositing an array of organic material. Recent successes in fabricating organic light emitting diodes (OLEDs) have driven the development of OLED displays (see S. R. Forrest, *Chem. Rev* 97, 1793 (1997)). OLEDs makes use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Several OLED materials and configurations are described in U.S. Pat. No. 5,707,745, which is incorporated herein by reference in its entirety.

As is the case for fabrication of arrays using VTE, to adapt OVPD to OLED technology, a shadow mask delineating the shape of the desired pixel grid is placed close to the substrate to define the pattern of deposition on the substrate. Control of the shadow mask patterning is a critical step, for example, in the fabrication of full-color OLED-based displays (see U.S. Pat. No. 6,048,630, Burrows, et al.). Ideally, the resultant pattern on a substrate is identical to that cut into the shadow mask, with minimal lateral dispersion and optimal thickness uniformity of the deposited material. However, despite the overall advantages of OVPD in depositing organic layers, the use of the shadow mask in OVPD has certain disadvantages including: significant lateral dispersion compared to VTE; material waste; potential for dust contamination on the film from the mask; and difficulty in controlling the mask-substrate separation for large area applications.

SUMMARY OF THE INVENTION

It is an object of the present invention to provide a process of patterned deposition of organic materials onto substrates that utilizes the vapor transport mechanisms of organic vapor phase deposition. It is also an object of the present invention to provide an apparatus for performing this process of patterned deposition of organic materials onto substrates, without the need for a shadow mask.

A method of fabricating an organic film is provided. A non-reactive carrier gas is used to transport an organic vapor. The organic vapor is ejected through a nozzle block onto a cooled substrate, to form a patterned organic film. A device for carrying out the method is also provided. The device includes a source of organic vapors, a source of carrier gas and a vacuum chamber. A heated nozzle block attached to the source of organic vapors and the source of carrier gas has at least one nozzle adapted to eject carrier gas and organic vapors onto a cooled substrate disposed within the vacuum chamber.

In an embodiment of the present invention, by organic vapor jet deposition ("OVJD"), organic vapors are carried by an inert gas from the source cell, through a timed valve and into a nozzle block, from which they are ejected onto a substrate. Preferably, the substrate is cooled and the nozzle block is heated. Preferably, the substrate is translated at a rate v in synchronization with the valve timing to achieve the desired pattern of deposition. By controlling the gas flowrate, V, width of the nozzle, z, the distance to the substrate, d, the rate of substrate translation, v, the source temperature, T, and the valve timing, τ, a uniform thickness profile, t, may be achieved for multiple pixels of desired width. The process is preferably carried out at a reduced pressure to minimize the dispersion in l. Decreasing s and increasing V can also minimize the dispersion even at ambient pressures.

Typical deposition pressures for organic vapor jet deposition (OVJD) range from 0.01 to 10 Torr. Both amorphous and crystalline films may be grown by OVJD.

In an embodiment of the present invention, the carrier gas rate V is increased so that the bulk flow velocity is at least on the order of the thermal velocity of the molecules, about 100-1,000 m/s, creating a "jet" of material that is unidirectional. In mathematical terms, this condition may be met when the mean velocity in the direction of the axis of the nozzle (the bulk flow velocity) is at least on the order of the mean absolute velocity in directions perpendicular to the axis of the nozzle (the thermal velocity). Preferably, the mean velocity in the direction of the axis of the nozzle is at least as great as the mean absolute velocity in directions perpendicular to the axis of the nozzle. The term "absolute" velocity is used with respect to mean velocity in directions perpendicular to the axis of the nozzle, because the mean velocity in those directions may be about zero—for every molecule moving to the left at a particular velocity, there may be another molecule moving to the right at the same velocity.

An embodiment of the present invention further provides that under the appropriate conditions of substrate temperature, reactor pressure, and nozzle geometry, an array of sharp-edged pixels with a resolution of about 1 μm is achievable with jet deposition if the nozzle-substrate separation, s, is within the molecular mean free path of the carrier gas, λ. In addition, because of the unidirectional flow, use of a heavier carrier gas can provide better directionality of deposition and subsequently sharper pixels.

One advantage of certain embodiments of the present invention is that material waste is minimized due to the heating of the nozzle and the directional flow. For example, the nozzle may be heated to a temperature sufficient to avoid physisorbtion (condensation) of organic material on nozzle surfaces, thereby reducing waste, and also reducing the need to clean the nozzle. The substrate may be cooled to enhance deposition characteristics, and avoid a situation where the carrier gas heats the substrate to the point that organic material will not deposit. Another advantage is the absence of the masking step, resulting in an increased rate of production, a more compact deposition apparatus design, and the elimination of contamination from a shadow mask. In high-resolution deposition requiring a separation distance s typically less than 1 mm, contamination from a shadow mask using OVPD is especially problematic. An additional problem arises in maintaining that small mask-substrate separation over a large substrate area, particularly since the mask would normally be thin and flexible.

Another advantage of certain embodiments of the present invention is that the process may be used in manufacturing full-color organic light emitting diode ("OLED") displays by patterning the multiple color pixels on the same substrate without the need to use a separate shadow mask. The apparatus incorporates an array of nozzles arranged and operated synchronously much like the print-head of an ink-jet printer. Each nozzle may incorporate three source cells, for red, green and blue luminophores, with valve control for sequentially layering the materials, without having to move a shadow mask. For example, each nozzle may be connected to multiple source cells through different valves, such that the deposition from each nozzle may be alternated between different colors at different locations on the substrate. Or, each nozzle may be connected to only one of multiple source cells, where each nozzle has its own valve, or different groups of nozzles may be connected to different sources, with each group having its own valve, such that the nozzle block deposits a predetermined pattern of different organic materials.

Embodiments of the present invention provide a process of patterned deposition of organic materials onto a substrate, said process comprising: transporting organic vapors via an inert carrier gas moving at a flowrate V from a source cell, through a timed valve, and into a nozzle block, wherein said transport occurs at a pressure P and wherein said flowrate V of the inert carrier gas is increased so that the bulk flow velocity is at least on the order of the thermal velocity of the molecules; and ejecting the organic vapors via the inert carrier gas moving at the flowrate V from the nozzle block onto a cooled substrate, wherein the cooled substrate is maintained at a temperature T and at a distance s from the nozzle block.

Embodiments of the present invention further provides a process comprising: maintaining the cooled substrate at the distance s from the nozzle block while laterally translating one of said cooled substrate or said nozzle block at a rate v, wherein the rate v is synchronized with the timed valve to create the patterned deposition of organic materials.

Embodiments of the present invention further provides this process for patterned deposition at a pressure P between 0.01 and 10 torr.

Embodiments of the present invention further provides this process for patterned deposition wherein the distance between substrate and nozzle block s is within the molecular mean free path of the carrier gas.

Embodiments of the present invention further provides an apparatus for patterned deposition of organic materials onto substrates, said apparatus comprising: at least one nozzle jet, wherein each of said one nozzle jet comprises one or more source cells; one timed valve connected to each of the one or more source cells; and a heated nozzle block connected to the one timed valve.

Embodiments of the present invention further provides an apparatus for patterned deposition of organic materials onto substrates wherein the patterned deposition is a full-color organic light emitting diode display, and wherein at least one nozzle jet is a rectangular array of n x m nozzle jets, and wherein one or more source cells is three source cells for red, green, and blue luminophores.

Embodiments of the present invention further provides an apparatus for patterned deposition of organic materials onto substrates comprising a variable-aperture at the output of the heated nozzle block.

DETAILED DESCRIPTION

Embodiments of the present invention are directed to a process of patterned deposition of organic materials onto substrates utilizing the vapor transport mechanisms of organic vapor phase deposition, and to an apparatus for performing this process of patterned deposition. In one embodiment, the process comprises: transporting organic vapors via an inert carrier gas moving at a flowrate V from a source cell, through a timed valve, and into a nozzle block, wherein the transport occurs at low pressure P; ejecting the organic vapors from the nozzle block onto a cooled substrate via the inert carrier gas moving at a flowrate V; and laterally translating the cooled substrate, which is maintained at a distance s from the ejection end of the nozzle block, at a rate v. The rate of translation is synchronized with the timed valve to create the desired patterned deposition of organic materials.

Figure 1:
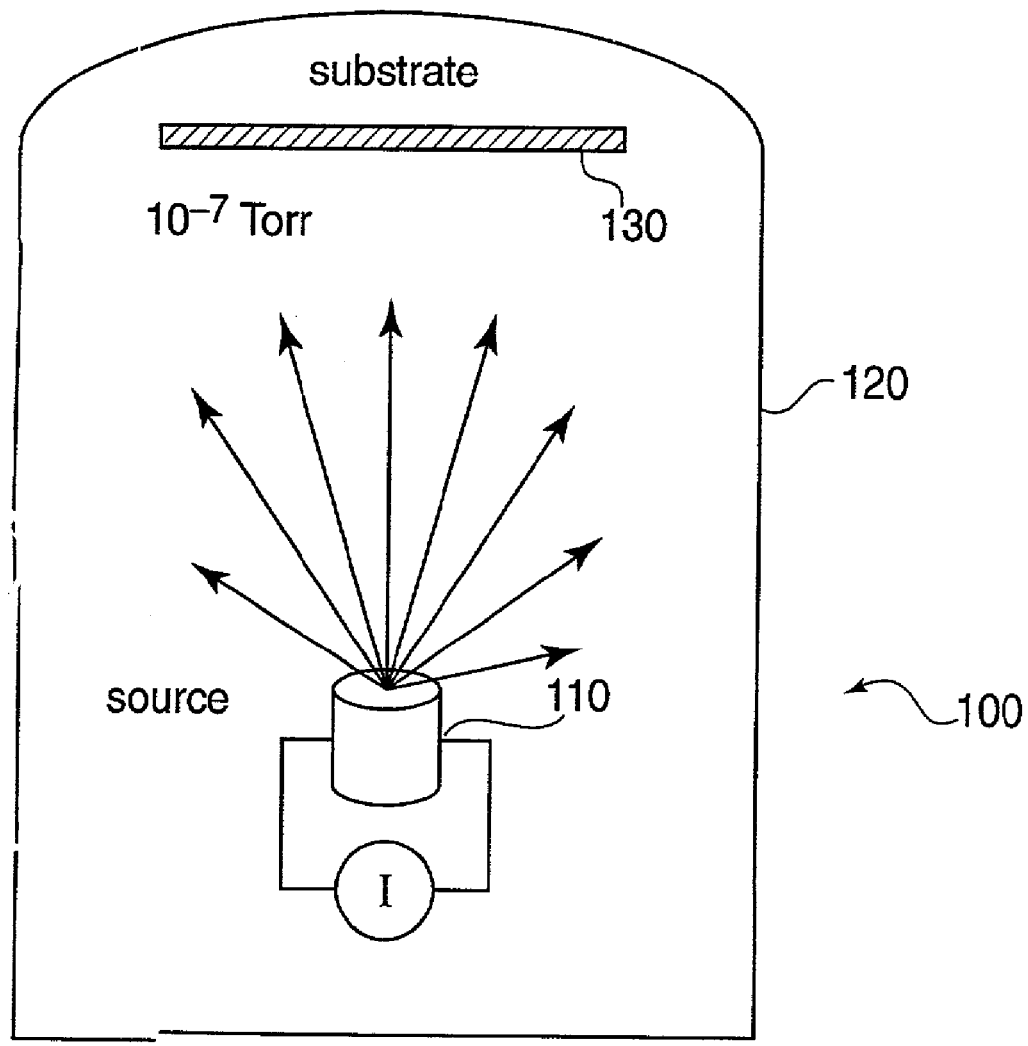
FIG. 1 shows a vacuum thermal evaporation system.

FIG. 1 shows a vacuum thermal evaporation (VTE) system 100. A source 110 is heated such that material evaporates into a vacuum chamber 120. The material diffuses through vacuum to substrate 130, where it may be deposited.

Figure 2:
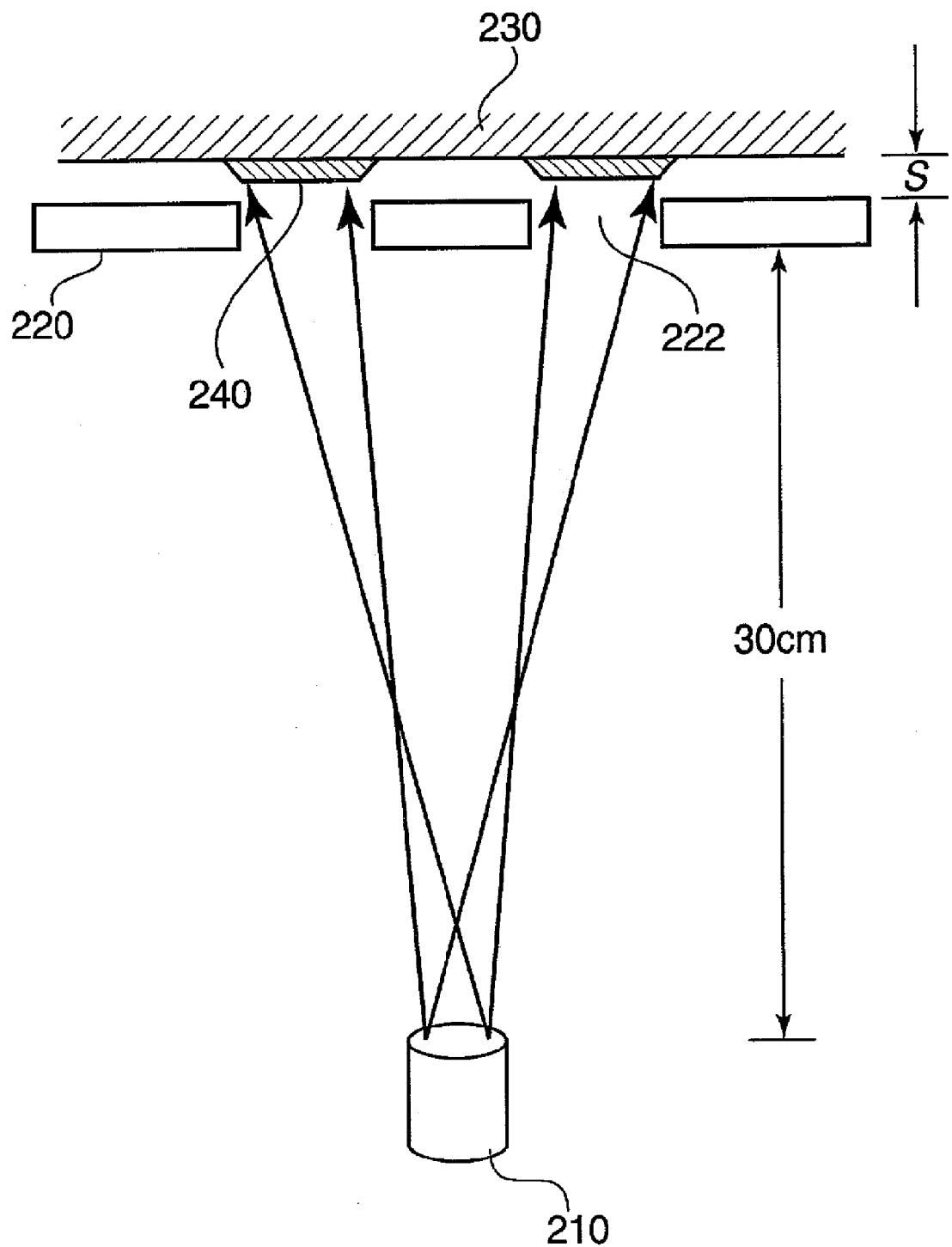
FIG. 2 shows a vacuum thermal evaporation system.

FIG. 2 shows a more detailed view of a VTE system 200 having a mask 220. A source 210 provides organic material that diffuses into a vacuum, on the order of $10^{-6}$ to $10^{-7}$ Torr. The organic material diffuses through the vacuum and through a shadow mask 320. Shadow mask 220, which has apertures 222, is disposed a distance s away from a substrate 230. After the organic material passes through the shadow mask, it deposits on substrate 230 to form patterned organic layer 240.

Because of the low pressures typically used for VTE, the molecular mean free path, $\lambda$, (also referred to as mfp) may be quite large. For example, at $10^{-7}$ Torr, $\lambda$ is about 1 m. As a result, for example, a mask-substrate separation of less than 50 μm can yield pixels of up to ~100 μm with well-defined edges, where the source-substrate distance in the chamber is on the order of 10-100 cm. Preferably, the distance between substrate 230 and source 210 is less than the molecular mean free path $\lambda$, such that collisions between molecules in the vacuum are minimal, and patterned layer 240 is deposited where there is a clear line of sight from substrate 230 to source 210, unblocked by mask 220. Using VTE, a pixel profile that is trapezoid with a well-defined, finite base may be obtained. $10^{-3}$ to $10^{-13}$ Pa is a preferred range of pressures for VTE.

Because source 210 is not a single point, patterned layer 240 may be slightly larger than aperture 222. With reference to FIG. 2, the length of the base of patterned layer 240, $l_3$, is given by:

$$l_3 = \frac{1}{2} \cdot \frac{(s+t) \cdot (l_1 + l_2)}{h}$$

where s=mask-substrate separation, t=mask thickness, $l_1$=source width, $l_2$=aperture width, and h=source-mask distance. This formula gives very close d values to those observed experimentally.

Figure 3:
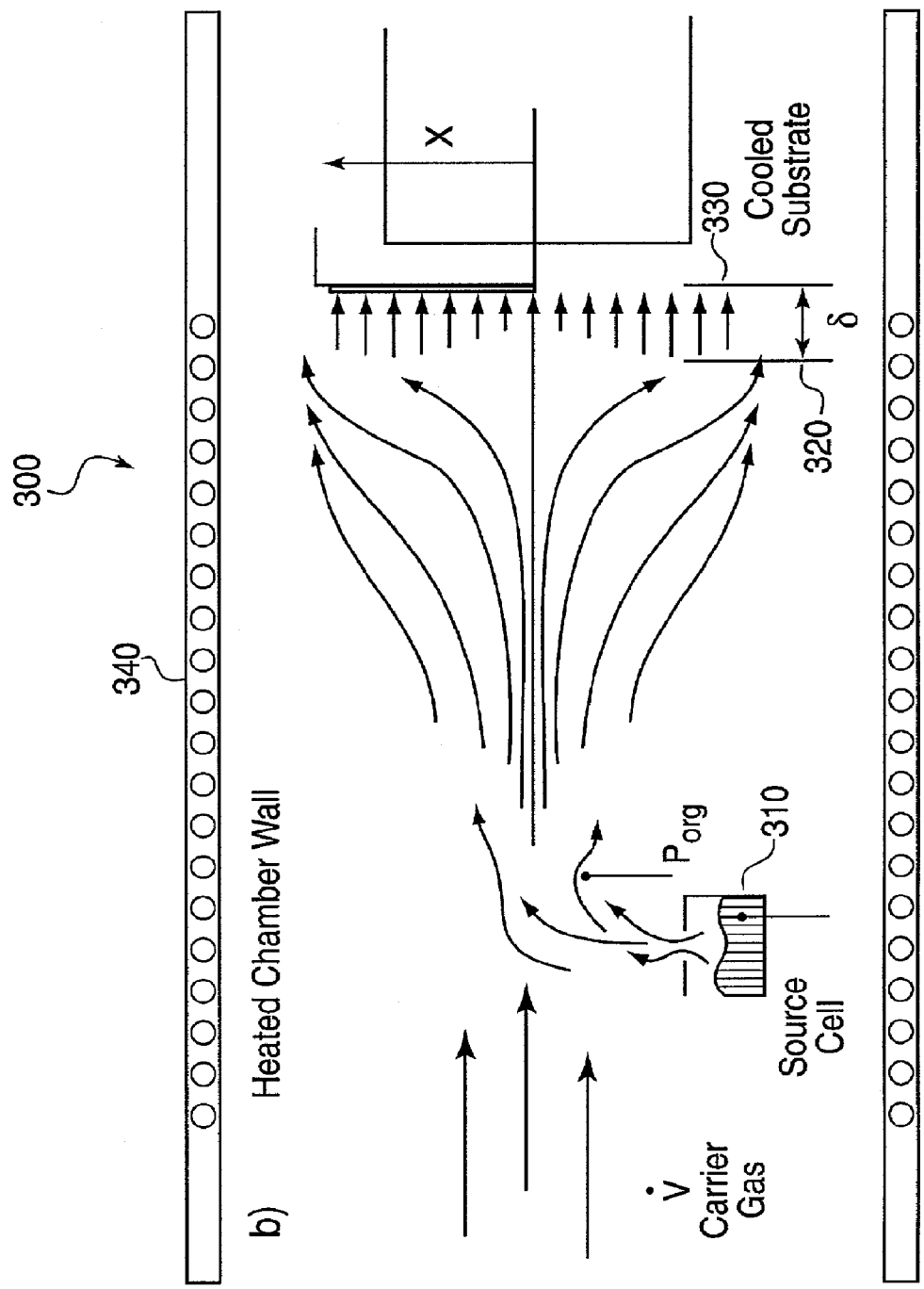
FIG. 3 shows an organic vapor phase deposition system.

FIG. 3 shows a organic vapor phase deposition (OVPD) system 300. A carrier gas is passed over a source cell 310, from which an organic material is evaporated into the carrier gas. Multiple source cells (not shown) may be used to provide a mixture of organic materials, and/or to provide different organic materials at different times. The carrier gas then passes through a mask 320 located a distance δ from a substrate 330. The carrier gas then impinges on substrate 330, where the organic material physisorbs onto the substrate surface. Substrate 330 may be cooled. Walls 340 of system 300 may be heated to reduce or prevent organic material from depositing on walls 340. The organic material may be a small molecule material, or it may be a polymer material.

Figure 4:
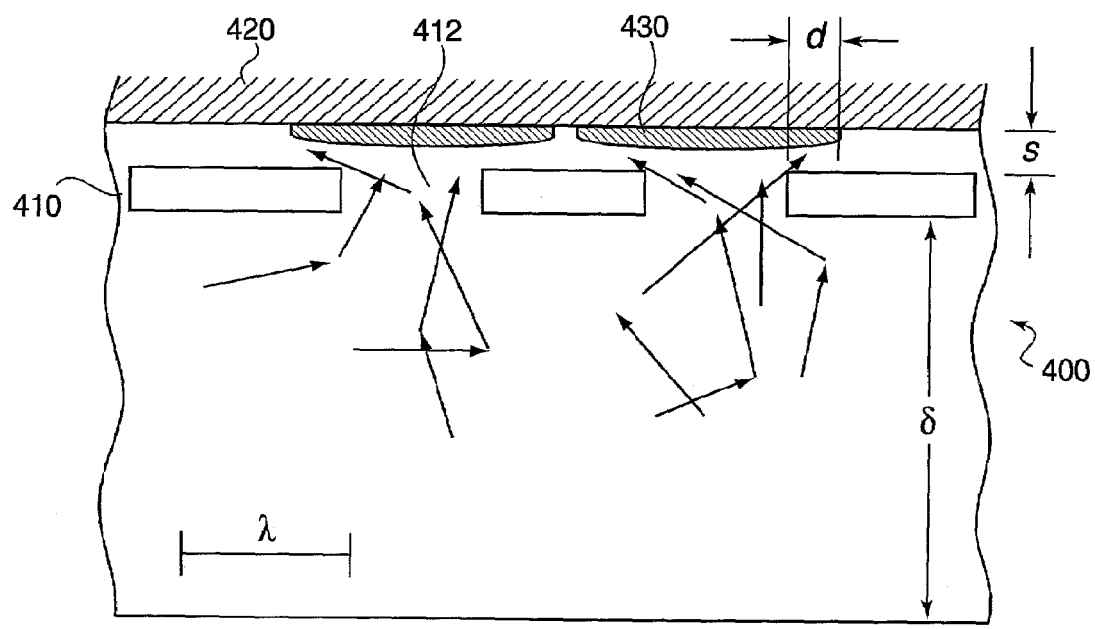
FIG. 4 shows an organic vapor phase deposition system.

FIG. 4 shows an OVPD system 400. A carrier gas is used to transport organic molecules from a source (not shown in FIG. 4, see, for example, FIG. 3). The molecules have an average mean free path $\lambda$. A mask 410 is disposed a distance s above a substrate 420. Organic layer 430 is deposited on substrate 420 through apertures 412 in mask 410. Because of collisions between molecules in the carrier gas, significant deposition of organic material may occur to a distance d under the mask, in regions that are not directly over apertures 412. The deposition is preferably carried out in at the lower end of the pressure range, such that the mean free path is greater than it would be at higher pressures, and d is correspondingly less, so that the micron-scale resolution preferred for full-color display applications may be achieved.

Figure 5A:
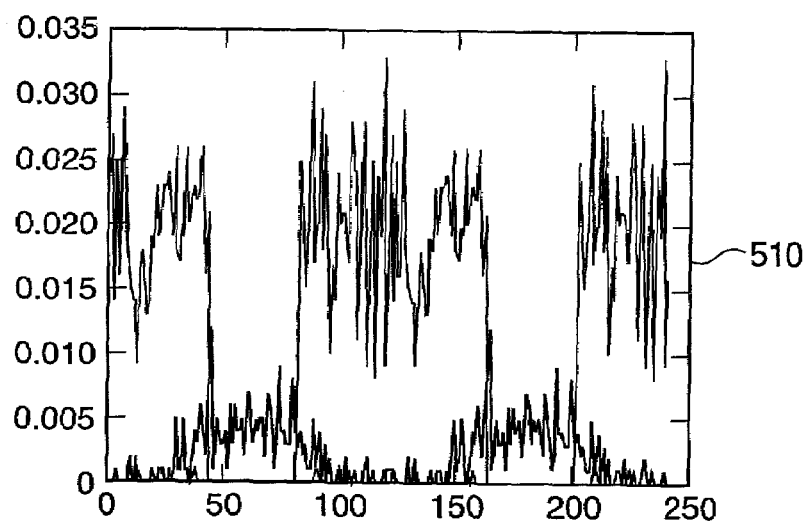
FIG. 5 shows simulated results for deposition through a shadow mask, showing the effect of varying deposition pressure.
Figure 5B:
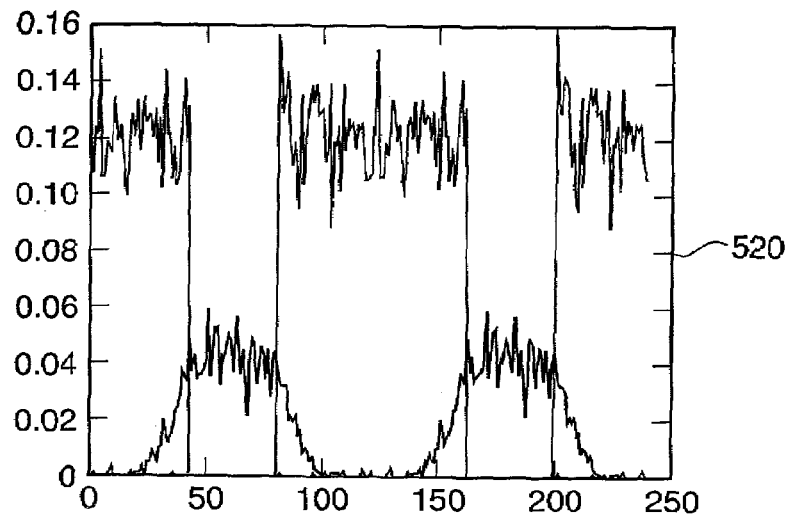
Figure 5C:
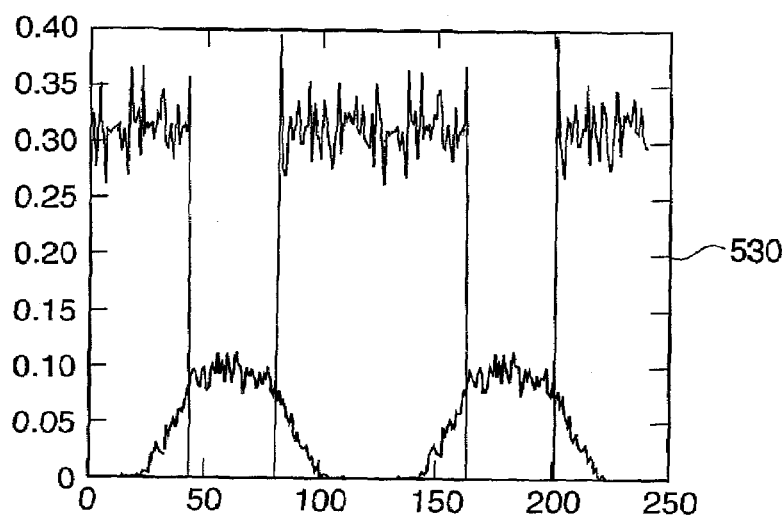

FIG. 5 shows simulated results for deposition through a shadow mask in the diffusive regime. For a nominal s=10 μm and mask thickness of 18 μm, the deposition patterns for λ=8.25, 82.5, and 825 μm ($P_{dep}$=0.01, 0.1, 1.0 Torr) are shown in FIG. 5. Molecules were launched from 2000 μm away from the mask at random angles having average molecular thermal velocities and allowed to diffuse throughout the simulated space volume. The concentration profile in the vicinity of the substrate was found to be linear, indicating that transport is purely diffusive. This is why, in FIG. 5, no difference in d is observed for different values of λ. Also in agreement with the continuum model, the fraction of molecules, which deposit on the substrate and the mask, i.e. the deposition efficiency, is lower for small λ, which correspond to small $D_{org}$. The simulation was performed with 30 μm wide mask openings; a mask thickness of 18 μm, and a mask separation, s=10 μm. Plots 510, 520 and 520 show deposition thickness profiles for the mask (higher) and the substrate (lower) for λ=8.25, 82.5, 82.5 with $P_{dep}$=1.0, 0.1, 0.01 Torr. There is no noticeable difference in the pixel shape between pots 510, 520 and 530, indicating that in the purely diffusive regime pressure has little effect on edge dispersion; the efficiency of deposition, as expected, drops for lower values of λ.

Figure 6A:
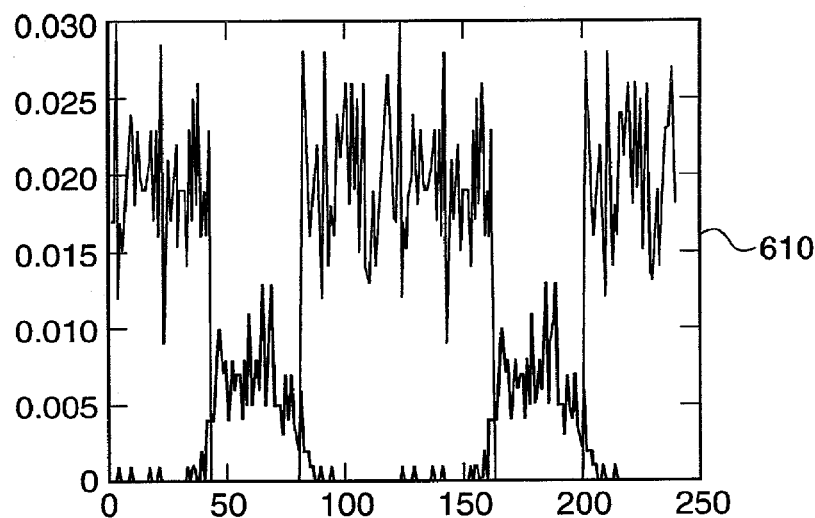
FIG. 6 shows simulated results for deposition through a shadow mask, showing the effect of varying the separation between mask and substrate.
Figure 6B:
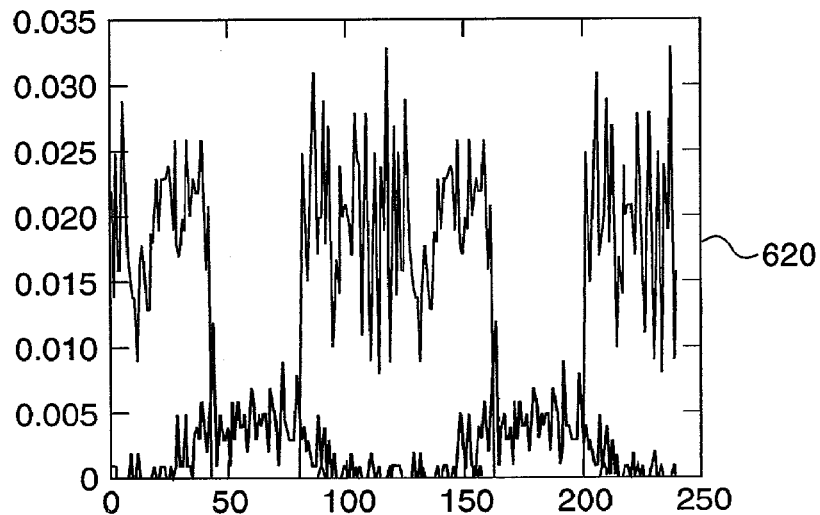
Figure 6C:
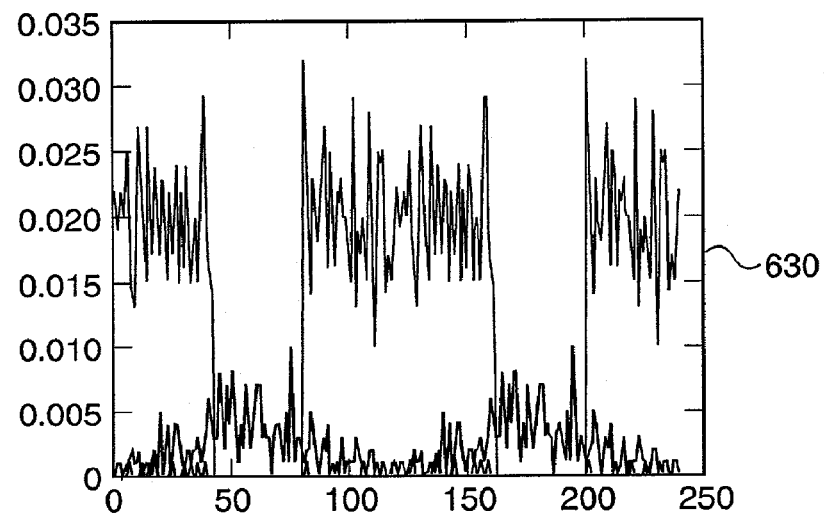

FIG. 6 shows simulated results for deposition through a shadow mask in the diffusive regime. The mask openings remain 30 μm wide, with t=18 μm and λ=82.5 μm, while s=3, 10, 20 μm, respectively, for plots 610, 620 and 630. Smaller values of s result in sharper pixels. As long as s~λ, trapezoidal pixel shapes may be obtained, similar to vacuum deposition Pixel overlap starts to occur when s~t. Keeping the purely diffusive framework for the simulation, FIG. 6 shows how variation in s affects pixel edge dispersion. Since λ does not affect d in this regime, we use λ=82.5 μm; for t=18 μm pixel cross-talk starts to occur when s=20 μm, i.e. as s approaches t, there is overlap of the neighboring pixels.

Figure 7A:
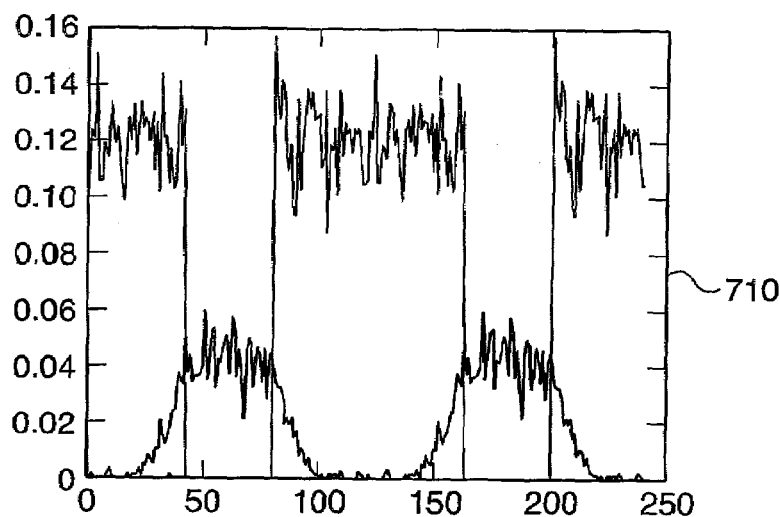
FIG. 7 shows simulated results for deposition through a shadow mask, showing the effect of varying mask thickness.
Figure 7B:
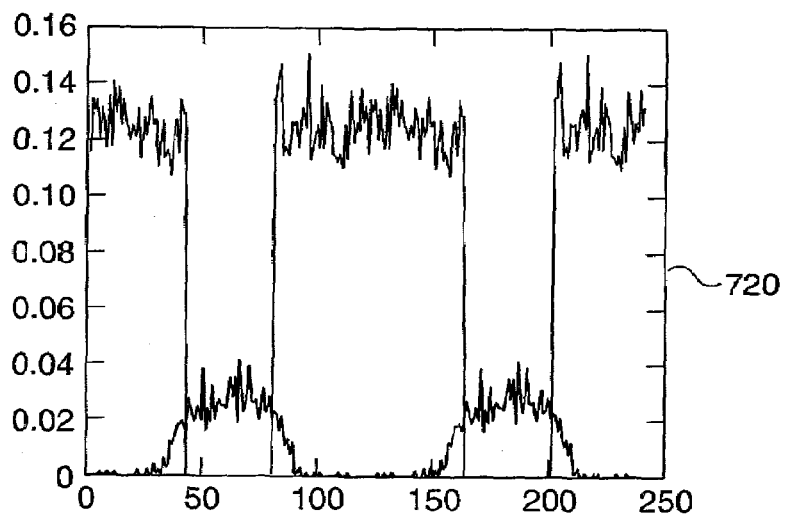
Figure 7C:
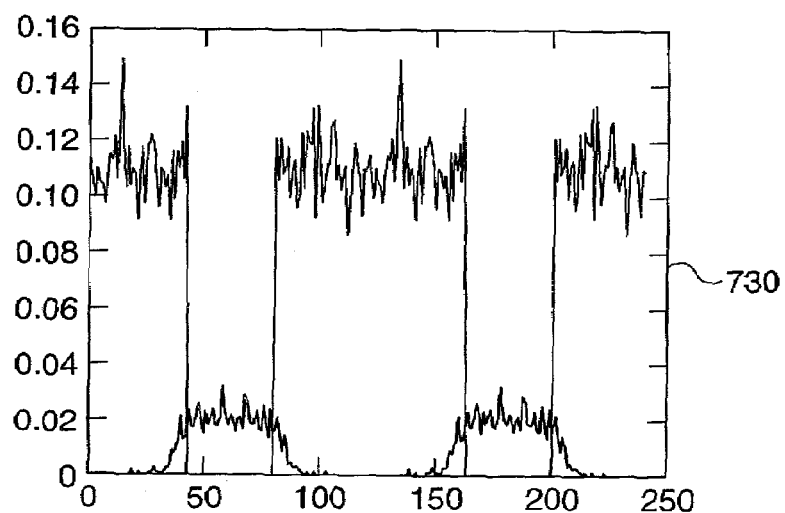

FIG. 7 shows simulated results for deposition through a shadow mask in the diffusive regime. The mask openings remain 30 μm wide, with λ=82.5 μm and s=10 μm. Here, mask thickness, t, is varied to 18, 36, and 54 μm, respectively, for plots 710, 720 and 730. Thicker masks result in sharper pixels, albeit at the expense of cutting off material flux to the substrate and reducing deposition efficiency, as can be seen by the low mask-to-substrate deposition ratio. As t approaches λ, the collimated molecular flux results in trapezoidal pixels, similar to vacuum deposition. The domeshaped profiles become increasingly like the vacuum-thermal deposited trapezoids as t approaches λ.

Figure 8A:
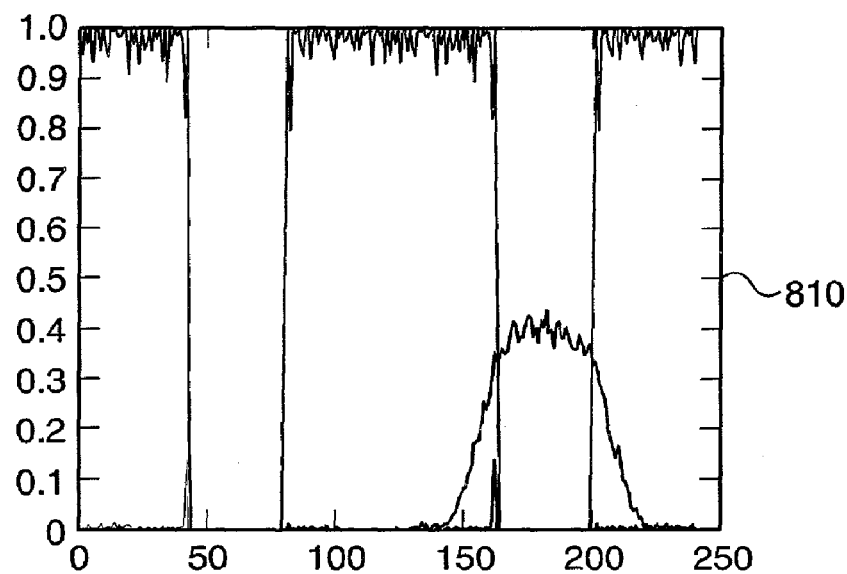
FIG. 8 shows simulated results for deposition through a shadow mask, showing the effect of varying the effective boundary layer thickness.
Figure 8B:
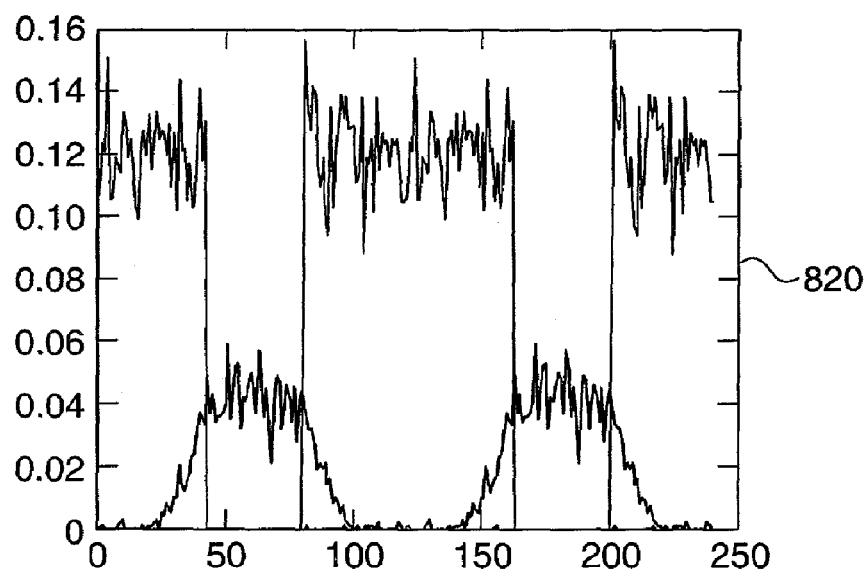

FIG. 8 shows simulated results for deposition through a shadow mask in the diffusive regime. The mask openings are 30 μm wide, with λ=82.5 μm and s=10 μm. Plots 810 and 820 show results for δ=410 and δ=2060 μm, respectively. Here, the effective boundary layer thickness is decreased from 2060 to 410 to 80 μm by adjusting the launching point to be closer to the substrate. As δ approaches λ, the deposition efficiency increases, in agreement with the continuum model for diffusion-limited transport to the substrate. Here, the effective δ was varied by launching the molecules closer to the substrate.

Changing the mass of the carrier gas in the purely diffusive deposition regime was found to have no first order effect on the deposition profile, as expected from the discussion of the previous sections.

Figure 9:
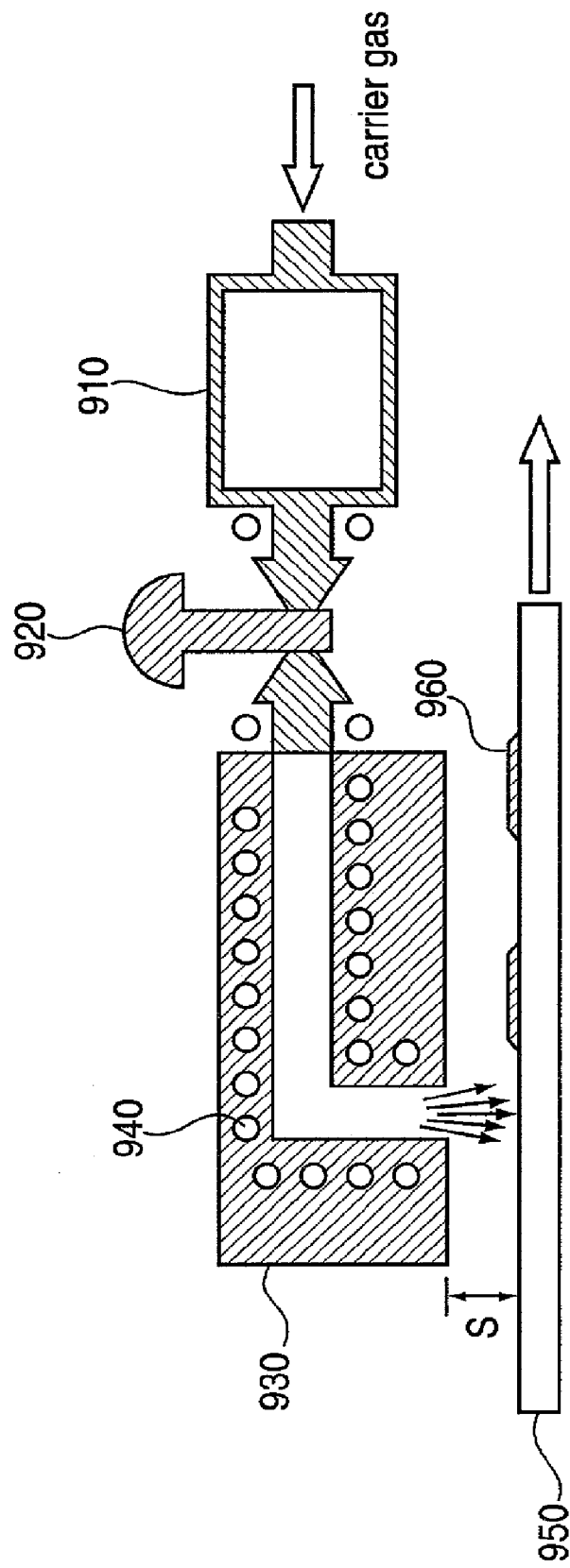
FIG. 9 shows an embodiment of an organic vapor jet deposition apparatus.

FIG. 9 shows an embodiment of an organic vapor jet deposition apparatus. The process of patterned deposition of organic materials onto substrates according to embodiments of the present invention will now be described in reference to FIG. 9.

In one embodiment, organic vapors are carried by an inert carrier gas from the source cell 910 into a timed valve 920. The source cell 910 is preferably kept at temperature T, and the inert carrier gas is moving at a flowrate V. The opening and closing of the timed valve 920 (i.e., the valve timing, τ) is preferably regulated throughout the process of patterned deposition. When the timed valve 920 is open, the inert gas carrying the organic vapors moves through the timed valve 920 and into the nozzle block 930. The nozzle block 930 preferably contains heating/cooling units 940 which are used to control the temperature of the inert gas carrying the organic vapors through the nozzle block 930. One difference between OVJD and OVPD is that the benefit of heated walls, such as heated walls 340, may be significant in OVPD, but less significant in OVJD. In particular, where nozzle block 930 includes heating units 940, the benefit of additional separate heating units that heat the walls of a vacuum chamber (not shown in FIG. 9) may not be needed. However, heating units that heat the walls of the OVJD vacuum chamber may nevertheless be used. The nozzle block 930 preferably has a nozzle with a width z. From the nozzle block 930, the organic vapors in the inert carrier gas are ejected out through the nozzle onto a substrate 950, preferably a cooled substrate, whereon the organic vapors condense to form a patterned layer 960. Preferably, the organic vapors must travel a distance s from the nozzle block 930 to the substrate 950. Substrate 950 may be moved at a rate of translation v, in between the deposition of material, during the deposition of material, or both. The substrate is preferably translated using a motorized stage, and both the stage and valve timing are operated and synchronized by computer control. The apparatus can be repeated in series for multi-layer deposition and multi-color display deposition.

By controlling the aforementioned process variables, a desired patterned deposition can be achieved. Specifically, a uniform thickness profile, t, can be achieved for a patterned layer 960 of a desired width l. By conducting the process at a reduced pressure, the dispersion in width l can be minimized. Furthermore, even at ambient pressures, decreasing the distance s from the nozzle block 930 to the substrate 950, and/or increasing the carrier gas flowrate V will minimize the dispersion in width l.

If the distance s from the nozzle block 930 to the substrate 950 in FIG. 9 is of comparable magnitude to the several microns separating the substrate from the shadow mask, and the gas flow rate V is sufficiently high, then the dispersion in l will be minimized, with resolutions expected on the order of 1 micron.

While it is relatively easy to achieve sharply defined pixels using vacuum thermal evaporation at pressures <$10^{-6}$ because the molecular mean free path, λ, is typically >30 cm, (see FIGS. 1 and 2), the situation is more complicated in OVPD. Because OVPD typically proceeds at pressures >0.01 Torr, with 0.1 μm<λ<1 cm, the increased frequency of intermolecular collisions in the vicinity of the mask plane leads to pixels with comparatively more diffuse edges (see FIG. 4). Nevertheless, we have demonstrated organic film deposition through a shadow mask with a pattern definition on the order of microns (see FIG. 10).

Figure 10:
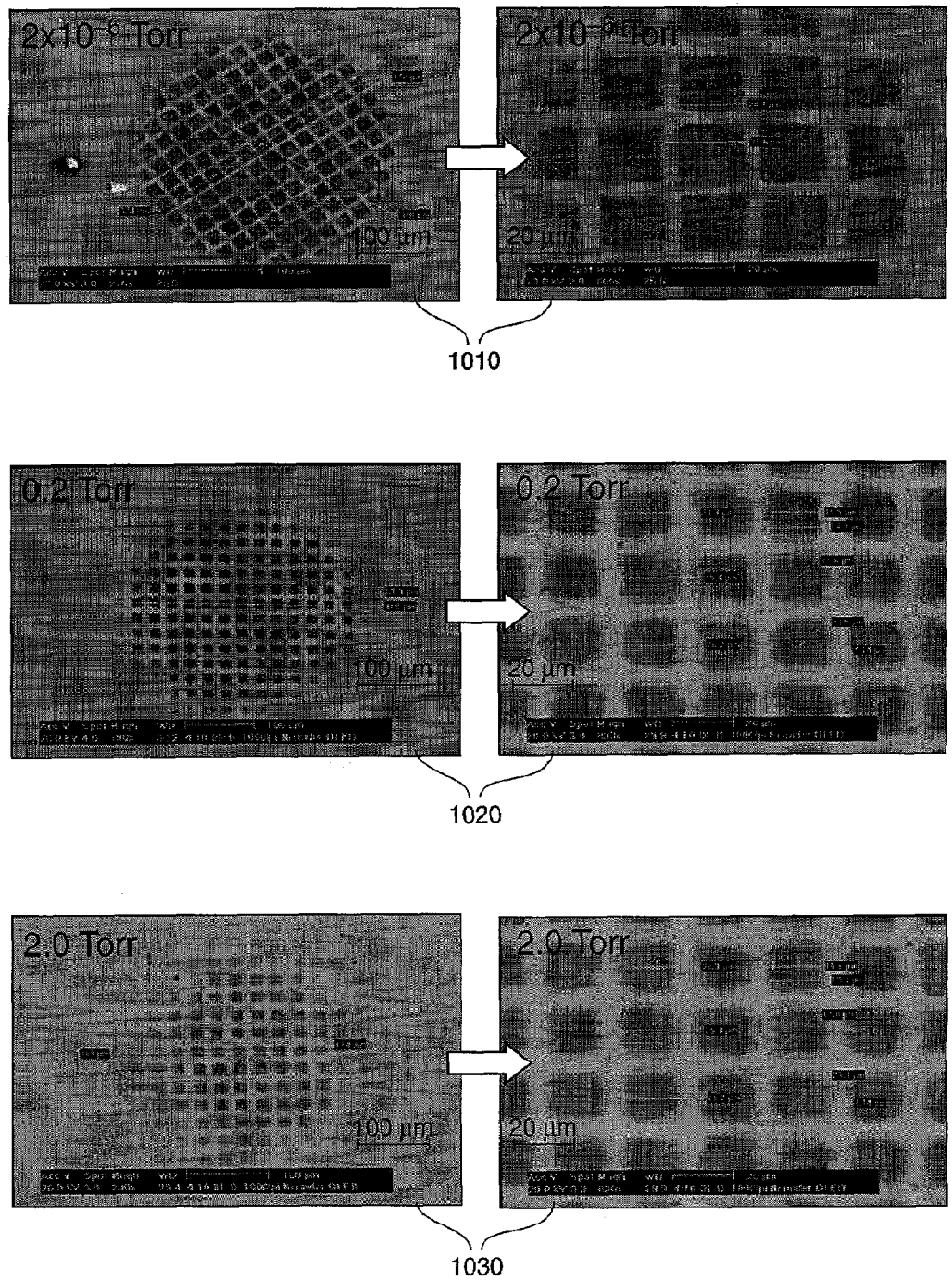
FIG. 10 shows scanning electron micrographs of some representative $Alq_3$ patterns formed on silver-coated glass substrates after deposition through shadow masks.

FIG. 10 shows scanning electron micrographs of the patterns resulting from OVPD through a shadow-mask at $P_{dep}$ ranging from 2×$10^{-6}$ to 2 Torr. As the deposition pressure increases, both simulations and experimental data indicate the loss of edge sharpness. Images 1010, 1020 and 1030 show results for $P_{dep}=2\cdot10^{-6}$, $P_{dep}=0.2$ Torr, and $P_{dep}=2$ Torr, respectively. The separation s=5 and 2.5 μm for the left and right column respectively. As predicted by the model, the pixels become more diffuse as pressure and mask-substrate separation increase. It was found that at pressures of 0.2 Torr and separation of up to 15 μm it is possible to achieve a pixel resolution on the order of several microns, which is sufficient for full color display applications.

Co-pending patent application describes the basis for organic vapor phase deposition ("OVPD") and is incorporated herein by reference. Co-pending provisional application, (herein "'901 application") is also incorporated herein by reference. The '901 Application is directed to a hybrid technique for the fabrication of organic devices, whereby organic materials are deposited using organic vapor phase deposition (OVPD) through a shadow mask, and metals are sequentially deposited via vacuum evaporation through the same shadow mask. In the '901 Application, the theory behind OVPD deposition is developed fully and models used for simulations are described. Using these same models developed for vapor phase transport, we have farther determined that a resolution of 1 micron is achievable if the bulk flow velocity is increased to create a gas jet and the substrate to nozzle distance is within the molecular mean free path. The model is described below.

The concept of OVPD is illustrated in FIGS. 3 and 4. The process consists of three steps outlined below. Vapors of a species A are generated by heating the source material in a stream of an inert carrier gas. Gaseous A is subsequently transported into the deposition chamber by the carrier gas, where the flow forms a hydrodynamic boundary layer (BL) in the vicinity of the substrate. In the last step, organic molecules (present in typical concentrations of <0.01%) diffuse across the BL and physisorb or adsorb on the substrate. These three stages of transport may be represented as a series of reactions:

Evaporation: $A_s A_g$ (1a)

Entrainment by carrier gas: $A_g \rightarrow A_{cg}$ (1b)

Transport to the substrate:

(2)

Diffusion to substrate surface: $A_{cg,s} A_{s,s}$ (3a)

Surface diffusion and immobilization:

(3b)

where $A_s$ represents an organic molecular species in the solid or liquid state. Species $A_s$ and $A_g$ evaporate and recondense inside the source cell with characteristic rates $k_{evap}$ and $k_{cond}$, respectively. Evaporation takes place either in the so-called "kinetic" regime, where $k_{evap} > k_{cond}$, or is in an equilibrium regime, where $k_{evap} = k_{cond}$. The organic species is swept out of the source cell by the carrier gas in (1b). Entrainment by the carrier results in taking $A_{cg}$ to the vicinity of the substrate with a characteristic bulk transport rate, $k_t$, where it becomes $A_{cg,s}$, with an overall efficiency of ≈100%, while the remainder is pumped out of the deposition chamber. Deposition takes place by diffusion of A across the boundary layer and adsorption with a characteristic rate $k_{ads}$. The overall deposition rate, $r_{dep}=k_{dep}-k_{des}$, where $k_{des}$ is the rate of desorption from the substrate.

With qualifications with respect to the highly molecular nature of OVPD to be discussed below, we can state that, typically, the ratio of carrier gas velocity to the mean molecular velocity, $v_c/u$, is about 0.01-1, i.e. the flow in LP-OVPD is either below or borders on the sonic regime. Due to the low pressure used, the Reynolds number, Re, is well within the laminar flow regime (Re <<2000). The Grashof number, Gr, in the vicinity of the substrate is also less than 1, implying that natural convection is not significant in gas mixing near the substrate. For the present discussion of deposition dynamics, only the steps 2, 3a and 3b are relevant. Since the efficient deposition of amorphous thin films requires minimal surface diffusion and desorption, we employ the lowest practicable substrate temperatures. Two things happen in this case: $k_{ads}>>k_{des}$, while the crystallization rate, $k_c$, is very high, meaning that the surface diffusing organic molecules become immobilized much faster than they diffuse to the substrate. Thus, "reaction" 3b is very fast and does not need to be considered for deposition of amorphous films. The rate-limiting steps are thus 2 and 3a.

As shown in previous work, (see M. Shtein, et al., *J. of Appl. Phys.*, 89: 1470 (2001)), the overall deposition rate, $r_{dep}$, for the combination of steps 2 and 3a can be expressed as:

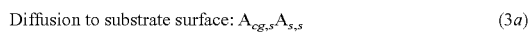
(4)

where $P_{org}/RT$ is the concentration of the organic species, $\dot{V}$ is the carrier gas flow rate and is equivalent to the variable V, which is also used to denote the carrier gas flow rate throughout this disclosure, δ is the BL thickness, and $D_{org}$ is the diffusivity of organic molecules in the carrier gas. The kinematic viscosity itself depends on pressure via: $v=\mu/\rho$, where $\rho=P/RT$. Increasing the background gas pressure, $P_{dep}$, will result in a sublinear decrease in the deposition rate, $r_{dep}$, due to two opposing factors: a decrease in the diffusivity, $D_{org}$, which lowers $r_{dep}$, and a decrease in δ, which improves the transport rate. This equation may be used to predict the overall deposition rate for given process conditions and, coupled with a surface molecular diffusion model, to estimate crystallization rate and grain size of polycrystalline thin films.

In the vicinity of the substrate the system may be engineered as a gas jet impinging normal to a flat plate, a uniform flow coming to stagnation near a flat plate, or flow impinging on a rotating disk (to improve coating uniformity); in all cases, δ takes the form:

(5)

where v is the kinematic viscosity of the gas, and α is a quantity decreases linearly with $\dot{V}$ and/or the rate of rotation in such a way that the formula may be used directly to estimate δ S in units of cm when v is in cm²/s and bulk flow axial velocity in cm/s is used for α. For typical conditions used in OVPD and in this work, such as T=275° C., $P_{dep}$=0.2 Torr and $\dot{V}$=15 sccm of nitrogen, δ is approximately 1-10 cm. However, since the δ is on the order of the axial dimension of the typical deposition chamber, the term boundary layer must be applied in OVPD with caution.

Patterned Film Deposition Using OVPD

The preceding discussion relies on the validity of the continuum assumption due to the use of the uniform bulk diffusivity, $D_{org}$, and the boundary layer thickness, δ. This section examines the validity of the continuum assumption when applied to shadow masking in OVPD.

A central question in analyzing OPVD through a shadow mask is to what extent the organic molecules retain their initial bulk flow velocity when they arrive at the mask plane. First, we assume the presence of a boundary layer, "BL," where by definition, the molecules lose memory of bulk transport, and their velocity distribution is fully thermalized. In this case, it can be seen qualitatively that the decrease in $D_{org}$ due to higher $P_{dep}$ will not make the patterns less sharp. Since $D_{org}$ is isotropic, the longer it takes for a molecule to diffuse perpendicularly to the substrate, the longer it will take (by the same amount) for it to diffuse laterally. The mutual cancellation of these rates will result in identical patterns at different pressures, which is not the observed experimental trend. A slightly more realistic model for $D_{org}$ (see Eq.(8) below, for example) is where it decreases in the direction of the substrate, along the decreasing temperature gradient. But once again, because the decrease is isotropic, the pattern should remain unaffected.

Relaxing the requirement for an isotropic velocity distribution within the boundary layer and allowing the molecules to retain the z-component of their initial velocity, it can be shown that $d_{max}$ is given approximately by:

$$d_{max} = const * \sqrt{6 * D_{org} * \frac{s}{u}}$$

where $d_{max}$ is the pixel edge dispersion, as shown in FIG. 4, and u is the carrier gas velocity in the deposition chamber. Here, we assumed that λ is small enough to model the process as diffusion from a series of point sources located along the mask aperture. The pixel edge dispersion increases with the square root of the pressure, through $D_{org}$ as well as the mask-substrate separation, s. Increasing the bulk flow velocity, naturally for this model, improves sharpness. However, this formula overestimates the pixel edge dispersion for moderate pressures (e.g. 0.1 Torr) by at least an order of magnitude, because the diffusive transport assumption does not strictly hold for the dimensions and pressures relevant to this discussion. Experimentally obtained deposition patterns suggest that the mechanism lies somewhere between the two diffusive modes.

Here, it should be noted that the continuum and hence the diffusion assumptions are incorrect for most of OVPD conditions. The Knudsen number (λ/L, where L=characteristic length) based on the dimensions of the shadow mask is large, and the mass and energy conservation equations no longer form a closed set. The VTE and OVPD mechanisms are shown schematically in FIGS. 2 and 4, respectively. The random collisions experienced by the organic molecules near the substrate are responsible for the lateral spreading of the pixels. Since, by definition, the complete randomization of molecular velocities takes place within the BL, the magnitude of δ is expected to affect the sharpness of the pattern. Furthermore, the latter will be limited by the following factors: molecular mean free path, λ, mask-to-substrate separation, s,
and the shape of the mask aperture. In terms of the process parameters, these factors are controlled via the deposition pressure, carrier gas flow rate, the type of carrier gas used, and design of the shadow mask. Since $D_{org}$ and λ are intimately related, we next examine how λ varies with $P_{dep}$ and its effect on pattern sharpness.

A Monte-Carlo type simulation may be used to model deposition through a shadow mask. We now set up the equations needed to carry out further analysis. From the logic in FIG. 4 it is evident that a larger λ will result in fewer intermolecular collisions inside the BL and, coupled with a laterally uniform concentration distribution above the shadow mask, less lateral dispersion of the pattern on the substrate. For a single-component, low-pressure non-polar gas, λ has the form:

$$\lambda = \frac{k_B \cdot T}{\sqrt{2} \cdot \pi \cdot \sigma^2 \cdot P_{dep}}. \tag{6}$$

Thus, by decreasing the gas pressure, the mean free path increases and sharper pixels will be obtained. However, pressure cannot be decreased indefinitely; the in-flow of a carrier gas used to transport the organic vapors necessarily gives rise to a background gas pressure. The limit of very low deposition pressure, $P_{dep}$, represents the free molecular transport regime, where λ is large and the carrier gas flow rate, $\dot{V}$, limits material transport. Increasing $\dot{V}$ results in greater $P_{dep}$ and transport becomes diffusion limited as λ decreases. The trade-off between using a sufficient carrier gas flow rate and maximizing gas-phase diffusion of organics gives rise to the 0.01 to 10 Torr optimum pressure range preferably used in OVPD.

While Eq.(6) may be used accurately with dilute, non-polar gases like helium and argon, OVPD deals with a mixture of complex molecules, e.g. $Alq_3$, along with the carrier gas, such as nitrogen or argon. The effective nominal mean free path and collision cross-section, λ and σ, can be determined via modified expressions for the diffusivity through Eq. 6 and the relationship:

$$D_{org} = \frac{1}{3} \bar{u} \lambda \tag{7}$$

Here, the Chapman-Enskog expression for the diffusivity of molecules with dipoles or induced-dipoles may be used:

$$D_{AB} = \frac{1.835 \cdot 10^8 \cdot T^{1.5} \left(\frac{1}{M_A} + \frac{1}{M_A}\right)^{0.5}}{P \sigma_{AB}^2 \Omega_{D,AB}}, \tag{8}$$

where $M_i$ is the mass of the diffusing species i, T is the gas temperature, and $\sigma_{AB}$ is the average collision cross-section, $\sigma_{AB} = [\frac{1}{2}(\sigma_A + \sigma_B)^2]^{1/2}$. The quantity $\Omega_{D,AB}$ is a dimensionless function of the Lennard-Jones intermolecular potential and temperature. Unfortunately, for the materials commonly used in OLEDs, reliable Lemard-Jones parameters are not available, and the Fuller correlation may be substituted:

$$D_{AB} = \frac{0.1013 \cdot T^{1.75} \left(\frac{1}{M_A} + \frac{1}{M_A}\right)^{0.5}}{P[(\sum v_A)^{0.5} + (\sum v_B)^{0.5}]^2}, \quad (9)$$

where $\Sigma v$ is the summed effective volume contribution of the individual structural components of the diffusing molecule. The various molecule-specific constants have been calculated using standard group contribution methods described elsewhere (R. B. Bird et al., Transport Phenomena, New York, John Wiley & Sons, Inc., pp. 508-513 (1960)). As evident from Table 1, the values of $D_{AB}$ vary by half an order of magnitude between the different theories, and it may be necessary to carry out more detailed experiments and/or molecular dynamics simulations to determine the binary diffusivities more accurately. However, approximate values of $\lambda$ and $\sigma$ should suffice for determining trends with pressure.

TABLE 1

| T (K) | $D_{org}$ (Kinetic Theory) (cm$^2$/s) | $D_{org}$ (Fuller et al.) (cm$^2$/s) | | $D_{org}$ (Chapman-Enskog) (cm$^2$/s) |
|---|---|---|---|---|
| 273 | 0.0355 (N$_2$) | 0.68 (N$_2$) | 0.105 (Alq$_3$) | 0.0629 (N$_2$) |
| 548 | 0.101 (N$_2$) | 2.30 (N$_2$) | 0.356 (Alq$_3$) | 0.179 (N$_2$) |

The Monte-Carlo simulation incorporating the above analysis proceeds as follows. The computational space is divided into a 3-dimensional grid with variable cell size. Particles representing organic molecules are assigned random initial locations inside the boundary layer and above the mask, and velocities that satisfy the Maxwell-Boltzmann distribution. After an elapsed time interval and a short travel distance no greater than $\frac{1}{10}^{th}$ of the mean free path, the molecule is allowed to collide with a locally generated carrier molecule having a random velocity from a Maxwell-Boltzmann distribution. The acceptance of collision is calculated using the following function:

$$P_{coll} = \frac{F_N \sigma_T u_r \Delta t}{V_C} \quad (10)$$

where $F_N$ is the number of real molecules represented by one simulated molecule, $\sigma_T$ is the total cross-section of the colliding molecules, $u_r$ is their relative speed, $\Delta t$ is the time interval allowed for the collision to take place, while $V_C$ is the volume of the cell in which the collision occurs. The value of $\sigma_T$ can be calculated from $d_{eff}$, an effective collision diameter which scales with the relative particle velocity, $v_r$:

$$d_{eff} = d_0 \cdot \frac{v_r}{v_{r0}} \quad (11)$$

The whole process is repeated, while the mega-molecules are tracked in space. Upon collision with the substrate plane or any side of the mask, the organic particles are immobilized there. Periodic boundary conditions are imposed laterally, while a constant concentration of organics and carrier gas is set at the edge of the boundary layer. The simulation runs until a desired film thickness has been formed on the substrate. Tracking mega-molecules consisting of several individual molecules is done to save computational costs. The simulation was applied to generate the results shown in FIGS. 5 through 8.

Figure 11:
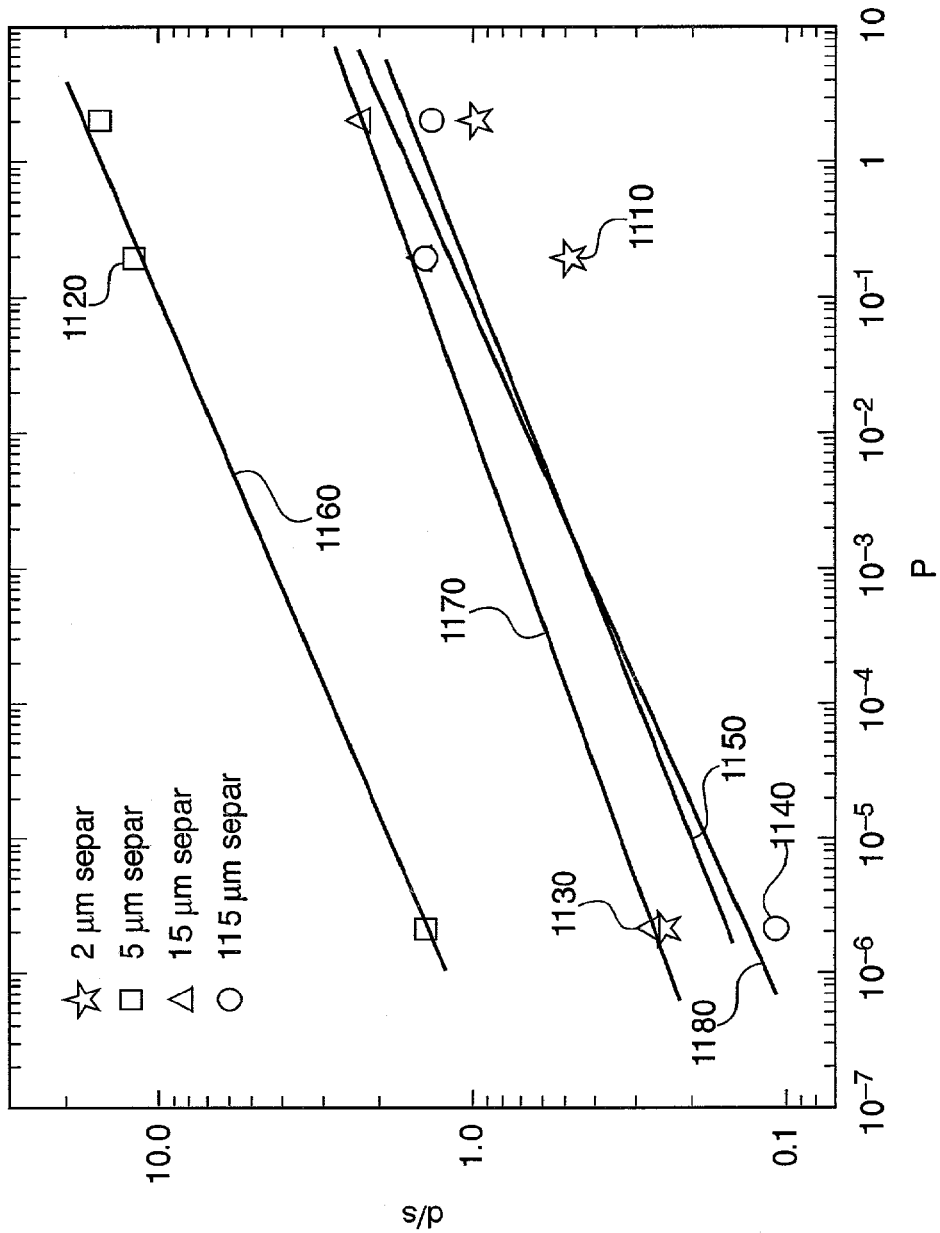
FIG. 11 shows a plot of the dimensionless dispersion parameter, R=d/s, versus deposition pressure, $P_{dep}$.

FIG. 11 shows plot of the dimensionless dispersion parameter, R=d/s, versus deposition pressure, $P_{dep}$ (bottom axis) and mean free path, $\lambda$ (top axis), for both experimental and simulated results. Star symbols 1110, square symbols 1120, triangle symbols 1130 and circle symbols 1140, show experimental results with a mask-substrate separation of 2, 5, 15 and 115 microns, respectively. Plots 1150, 1160, 1170 and 1180 show simulated results for a mask-substrate separation of 2, 5, 15 and 115 microns, respectively. As the pressure decreases, R does not decrease to zero, but rather saturates at a constant value, characteristic of the finite size of the source in VTE and the source-mask and mask-substrate gaps. The points between 10$^{-6}$ and 0.2 Torr are not readily accessible with the current experimental set-up and were filled in using the Monte-Carlo simulation.

If the molecules are allowed to keep their original bulk flow velocity as they enter and propagate through the BL, the deposition profiles become sharper. They approach the trapezoidal shape characteristic of vacuum deposition when the bulk flow velocity, $U_{bulk}$, approaches the molecular thermal velocity, ú. This suggests a mode of deposition where organics are "sprayed" onto the substrate using an ultra-fast jet of carrier gas, similar to ink-jet printing.

Figure 12:
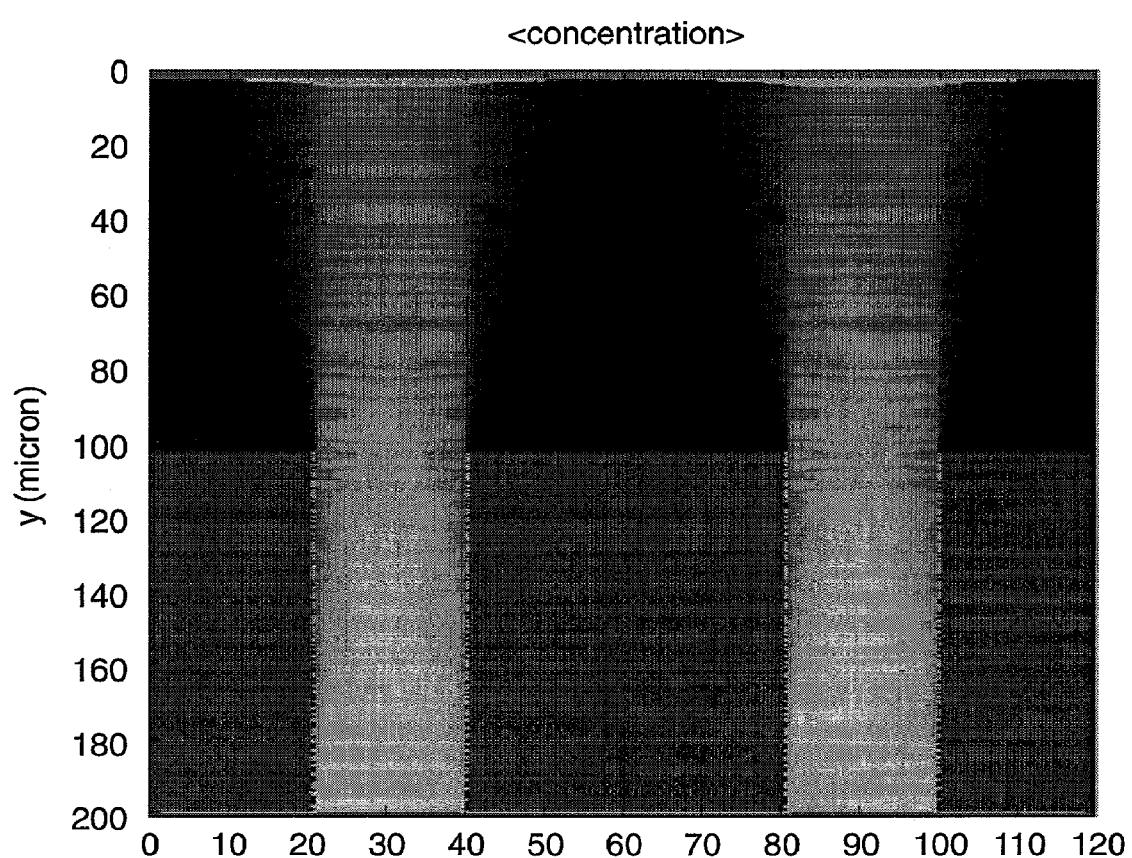
FIG. 12 shows a material concentration map.
Figure 13:
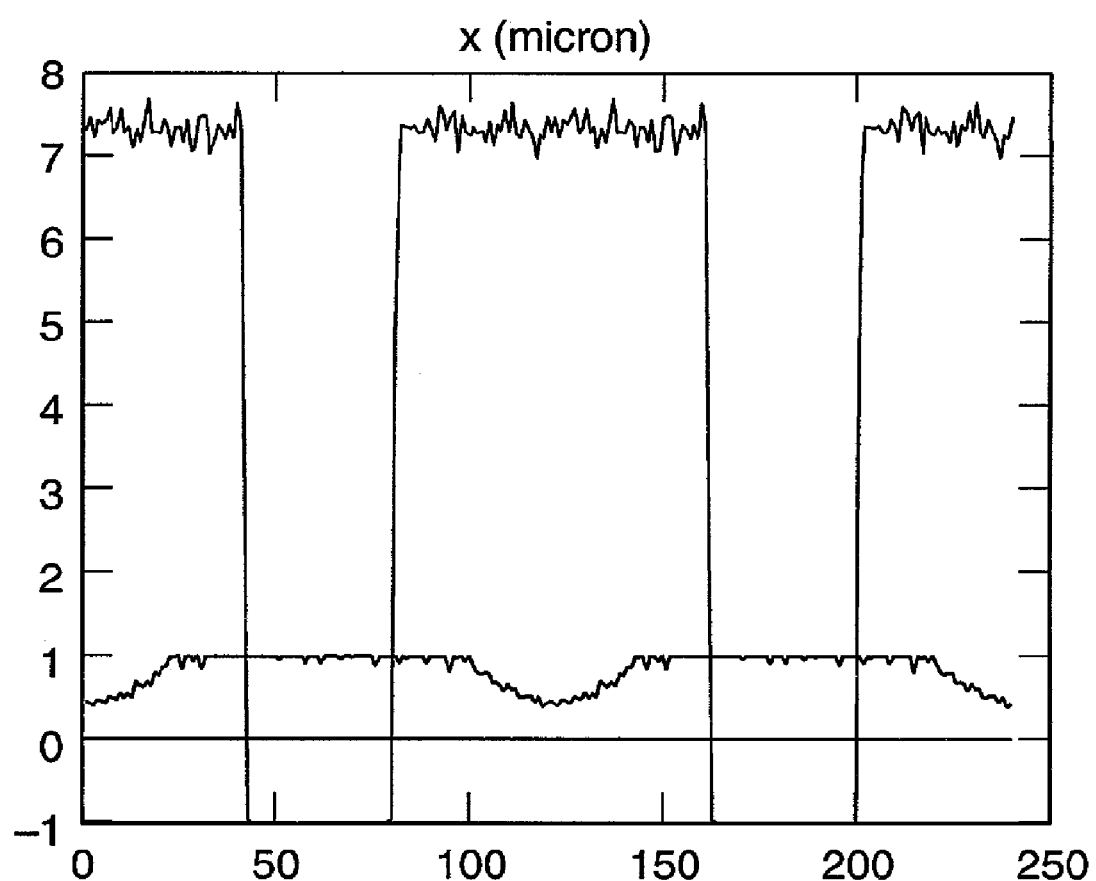
FIG. 13 shows simulated profile of material deposited by organic vapor-jet deposition.

An example of vapor-jet deposition mode is illustrated in FIG. 12, with the simulation results in FIG. 13. FIG. 12 is a material concentration map which shows the jet-like character of deposition with ultra-fast carrier flow for simulated Alq$_3$ flowing past a 100 mm thick mask with an initial vertical velocity of 100 m/s. Vertical dimension is 200 μm, horizontal=60 μm. The overall deposition efficiency of this process can approach 100%, since pixels are patterned by the directed gas jets and no material is wasted in coating the shadow mask. A deposition system with individual nozzles for each color pixel may provide an efficient, precise, and more portable deposition system.

FIG. 13 shows a plot of the thickness of material deposited (simulated) by OVJD. Vertical dimension is 9 μm, horizontal=60 μm.

In the regime representing the present invention, in which a gas jet impinges normal to a flat plate, (Equation 5 herein) the models developed above are applied to ascertain the process parameters for an organic vapor jet deposition apparatus. Operation in this regime was first suggested by the observation, both through the simulations presented here and through experimental verification, that sharp pixels could be obtained by OVPD using a shadow mask, if the mask-substrate separation distance was reduced to the order of the molecular mean free path, $\lambda$. Additionally, by increasing the mask thickness, the molecules that do reach the substrate become effectively collimated, resulting in sharper patterns, albeit at the expense of deposition efficiency. If, however, the thick mask is also heated, material losses are minimized. Increasing the aspect ratio of the mask aperture above 10 and increasing the carrier gas velocity perpendicular to the substrate results in a gas jet being formed at the exit of the mask. In the jet deposition regime, therefore, the thick mask design converges to the heated nozzle of the present invention. The process parameters for OVJD are now discussed below.

In one embodiment, the carrier gas flow rate, V, for jet deposition has to be sufficient to create a "jet" of material, as suggested by the name. To make the gas flow appear as a unidirectional jet stream, the bulk flow velocity has to be on the order of the thermal velocity of the molecules (~$(8kT/\pi m)^{1/2}$) or greater. For example, at room temperature, the thermal velocity of nitrogen, $N_2$, is approximately 450 m/s. Thus, the rough magnitude of the total volumetric gas flow rate is 450 m/s*$A_{cs,tot}$, where $A_{cs,tot}$ is the total cross-sectional area of the nozzles. The nozzle geometry is selected according to the particular application.

The source temperature and gas flow rate together control the concentration of the organic vapors in the gas phase, (see M. Shtein, H. F. Gossenberger, J. B. Benziger, and S. R. Forrest, *J. Appl. Phys.* 89:2, 1470 (2001)). Thus, T is set by the required concentration, which is, in turn, set by how much material needs to be delivered, $M_A$.

Given the amount of material A, $M_A$, to be deposited for a particular layer of a particular device within a reasonable time segment, Dt, the concentration of material A, $C_A$, is set by:

$$C_A = M_A/(V^*\Delta t)$$

where V is the volumetric flow rate of the carrier gas (plus the material, which is usually, but not always, insignificant). The total amount of material to be delivered, $M_A$, for one pixel is given by (pixel area)*(layer thickness). The pixel size of a typical OLED display is on the order of microns to tens of microns, and the thickness of individual layers is typically on the order of 0.1 micron. Preferably, the process pressure is ultimately dictated by the solubility of the organic (or other) compound in the gas used at the operating pressure and temperature, i.e. the maximum mole fraction of A, $x_A$, that can be in the carrier gas without condensing on the walls or in the gas phase. The sufficient number of carrier gas molecules present in the flow to entrain all of the solute vapor molecules in a particular carrier gas can then be calculated. This and the total gas flow rate and the total pumping capacity and speed of the OVJD system determine the operating pressure. Since all the variables are interdependent, an iterative process is used to develop the proper operating parameters for a particular deposition and application.

Preferably, the separation or working distance, s, in the OVJD apparatus is governed by the hydrodynamics of the jet and the operating pressure. Typically, but not strictly necessarily, for minimum pixel edge dispersion, s will be on the order of (or less than) the molecular mean free path, $\lambda$, of the gas system at hand, where (see also equation 6 herein):

$$\lambda \sim \text{const}^* T_{gas}/\sigma^2 P_{dep}$$

where $T_{gas}$=gas temperature, $\sigma$=average molecular diameter, $P_{dep}$=deposition pressure. For $Alq_3/N_2$ system, for example, $\lambda \gg$ 1500, 150, 15, 1.5 μm for $P_{dep}$=0.01, 0.1, 1, and 10 Torr, respectively, at T=275° C. Under these conditions, in the time it takes the vapor molecules to traverse the distance from nozzle to substrate, the time for lateral dispersion of the jet is minimized. However, the smaller the working distance, the more difficult the construction of the apparatus will be, and the more difficult it will be to keep the substrate cold, while keeping the nozzles hot to prevent condensation. Therefore, it is undesirable to decrease the working distance much below the threshold necessary to achieve the required pixel resolution.

Preferably, the cross-sectional area of an individual nozzle, $A_{cs}$, and its shape are dictated by the shape of the pattern that is to be obtained. Since the operating pressure is likely to be such that the mean free path of the molecules is short, the working distance is also small, on the order of microns. Given the flow velocity, working distance, and pressure drop across the nozzle, its shape is designed to suit the desired lateral dispersion; ideally, the nozzle width corresponds to the width of the pixel deposited.

In OVPD with shadow masking, the step preceding diffusion is delivery of vapors by the carrier gas to the vicinity of the substrate. Bulk flow velocity here is about 1-10 m/s. The final step in deposition is the diffusion of molecules across the boundary layer, where the molecular velocities are isotropic, giving rise to the pixel edge dispersion. Preferably, for a given mask-substrate geometry and material system, this dispersion is dictated by $\lambda$ only. Changing the carrier gas from $N_2$ to Ar for example, may have a minor effect, since $\sigma_{AVE}=\sigma_{N2}+\sigma_{Alq3}$, and $\sigma_{Alq3} > \sigma_{N2,Ar}$. The difference in the mass of the carrier gas molecule makes no difference; heavier molecules merely travel slower, so that the momentum transferred in an Alq3-$N_2$ or Ar collision with a thermalized, isotropic velocity distribution is the same.

In OVJD, however, we gain another control knob for the pixel shape. Since the carrier molecules are pushed through a conduit by a large pressure drop at velocities on the order of the thermal velocity, ~100-1,000 m/s, the momentum transfer in a collision is no longer isotropic, nor is it governed by the thermal velocity distribution. Rather, it is unidirectional, substrate-directed and is proportional to the mass of the carrier gas molecule (its velocity is controlled by the pressure drop now, rather than gas temperature). By using a heavier carrier gas, therefore, we can achieve better directionality of deposition and therefore sharper edge profiles and in the case of vapor deposited OLED displays, sharper pixels.

OVJD differs from and improves upon shadow-masking in many ways, including (but not limited to): the elimination of thin and flimsy shadow masks; elimination of dust contamination from organics condensed on the mask; eliminates the problem of mask-substrate separation control for large area applications; improves deposition (material) efficiency; offers the advantage of control over pixel shape; offers spatially specific deposition; and finally, an OVJD apparatus has the potential for portability and private use.

The deposition of organic thin films of Aluminum ($Alq_3$) was carried out using a multi-barrel glass reactor system with in situ temperature and thickness measurement capability, described in detail elsewhere. (M. A. Baldo, et al. *Phys Lett.*, 71: 3033 (1997), which is incorporated by reference in its entirety). $Alq_3$ is an example of the small molecule organic materials that are preferred for many OLEDs. Briefly, the reactor vessel is an 11 cm diameter by 150 cm long Pyrex® cylinder. It is heated by means of a three-zone furnace enabling source temperature control via positioning of each cell along the temperature gradient within the tube. Each source is separately encased in a 2.5 cm diameter by 75 cm long glass barrel. Carrier gas flow was regulated by mass flow controllers, while the deposition pressure is kept between 0:1 and 10 Torr by adjusting the pump throttle valve and the total carrier flow rate from 10 to 50 sccm. A 40 lpm vacuum pump with a liquid nitrogen cold trap is used to exhaust uncondensed carrier and organics. Organic vapors condense onto a rotating water-cooled substrate positioned behind a mechanically operated shutter. Film thickness and growth rate are monitored by a quartz crystal microbalance calibrated using the ellipsometrically measured organic film thickness.

In addition to deposition of organic thin films using OVPD, a conventional vacuum thermal evaporator was used. The source-to-substrate distance was approximately 30 cm; the deposition pressure was maintained at $10^{-6}$ Torr.

For the shadow-mask, we used a 5 μm thick nickel mesh consisting of 10 μm lines that interlace, forming 15 μm square openings. This mesh was placed directly on top of 1 mm thick silver-coated glass slides and covered with a 50 µm thick nickel mask containing round holes 1 and 0.3 mm in diameter. This arrangement allows for the simultaneous measurement of deposition for two values of s. Due to the profile of the nickel mesh, the smallest value of s is ~2 µm. Here, the dispersion values, d, for s=2 µm will refer to the fuzziness of the square pixels 7-10 µm on the side. Values of d corresponding to s=5 µm refer to the fuzziness of the circular deposition edge formed with the 1 mm and 0.3 mm holes of the 50 µm thick mask resting on top of the mesh.

Additional shadow masks were fabricated integral to the substrate, using a photoresist/chromium/photoresist (PR1/Cr/PR2) sandwich structure and photolithography, to provide the most accurate mask-substrate separations. Following the deposition of $Alq_3$, the resulting pixel patterns were examined using scanning electron microscopy.

One embodiment is an OLED display "vapor-jet printer." In this example, we deposit a 1000×2000 pixel array for a high resolution color display (~30×50 cm outer dimension). The "print-head" will consist of 1000 nozzles for the red luminophore, 1,000 nozzles for the green, and 1,000 for the blue. The rate of substrate and/or nozzle translation is dictated by the rate of deposition and the amount of material to be deposited.

Each pixel is 100×100 µm and requires 500 Angstroms of the dye-doped layer. A typical deposition rate in the current OVPD system is 10 Å/s, while the system has an efficiency of 5-10% With the vapor jet deposition, the materials use efficiency is likely to be 100%, but with 50% efficiency (100 Å/s), to deposit the entire screen, at 5 seconds per pixel set, would take ~3 hours plus translation time. However, if 2 linear arrays of nozzles are used, this time is cut in half. With the conventional shadow masking technique, the deposition of each of the luminophores in sequence can take from 3 to 10 minutes, with whatever additional costs and time required to clean the shadow mask, which could be substantial. However, with the combination of a properly sized nozzle array and deposition rate, which implies an increase in the organic vapor concentration and/or carrier gas flow rate, while keeping the source in the saturation regime, the OLED display "vapor-jet printer" can be at least comparable to OVPD using a shadow mask in production time and cost, especially since frequent cleanings would not be necessary, and material loss would be reduced.

Additional Simulation

Figure 14:
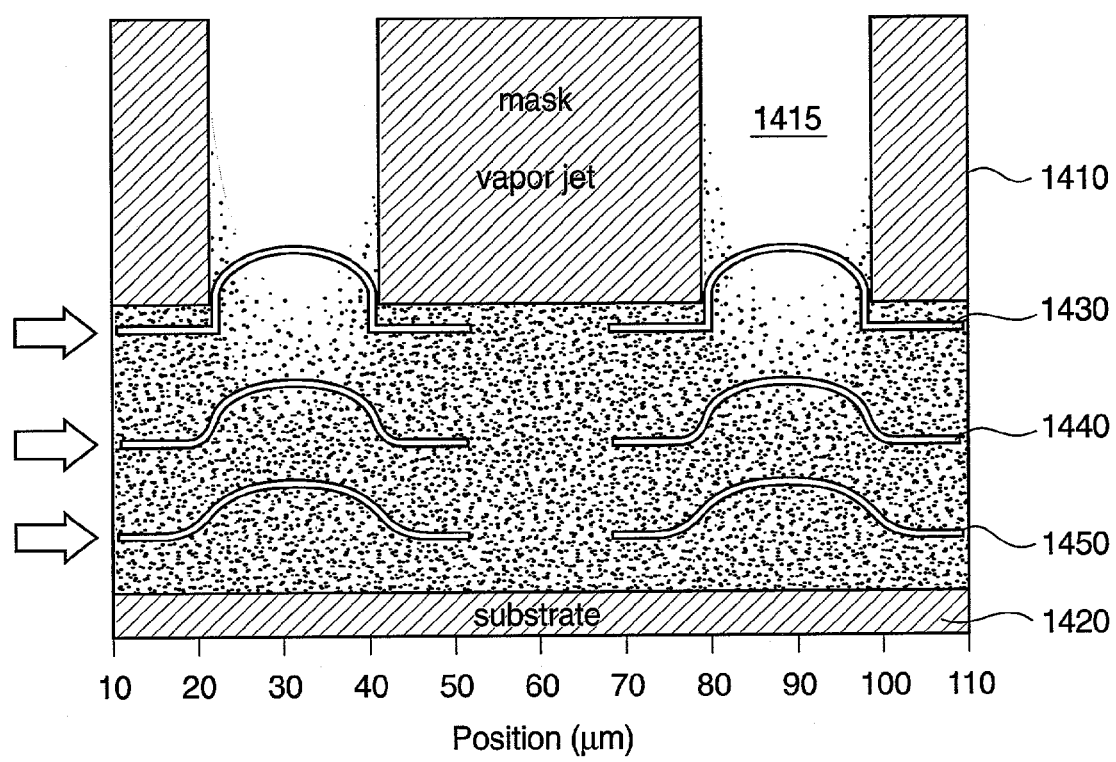
FIG. 14 shows simulated OVPD deposition results where the carrier gas has a bulk flow velocity.

Consider a jet of carrier gas delivered through a small-diameter capillary onto a cooled substrate. In the Monte-Carlo simulation, the z-directed carrier gas velocity, U, can be increased to simulate a jet which broadens only by the isotropic random molecular velocities superimposed onto this flow-field. FIG. 14 shows the spatial concentration profile for a simulated jet of $N_2$ carrying $Alq_3$, with mƒp=10 µm, t=50 µm, and U=100 m/s, while the mean thermal speed, $\bar{u}$=500 m/s. Since the flow-field was not known in this flow regime, the simulation kept dU/dz=0 for simplicity. The figure shows that the collimated jet can result in a deposit with well-defined edges even for s >>mƒp. Careful selection of U, $P_{dep}$, α and s may thus enable a printing method for molecular organic thin films analogous to ink-jet printing for polymers, except where the liquid solvent is replaced by a jet of highly volatile inert carrier gas. In FIG. 14, carrier gas with organic molecules is ejected from apertures 1415 in mask 1410, to impinge upon substrate 1420. Plots 1430, 1440 and 1450 illustrate different simulated deposition results where the jet nozzle is located at different distances from the substrate, and show a widening of the vapor jet as it moves further from the nozzle.

Although the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of depositing an organic film, comprising:
   providing a heated non-reactive carrier gas transporting an organic vapor; and
   ejecting the heated non-reactive carrier gas transporting an organic vapor through a nozzle block with a bulk flow velocity at least as great as the thermal velocity of the molecules, onto a cooled substrate, to form a laterally-patterned organic film;
   the laterally-patterned organic film comprising a plurality of raised physical features, each feature covering an area of not more than about 10000 $\mu m^2$.

2. The method of claim 1, wherein the nozzle block comprises a nozzle having a cross-section, and the shape of a feature in the deposited pattern corresponds to the cross-section.

3. The method of claim 2, wherein the width of the feature corresponds to the width of the nozzle.

4. The method of claim 1, wherein the nozzle is separated from the substrate by an amount on the order of the molecular mean free path of the carrier gas.

5. The method of claim 1, wherein the nozzle is separated from the substrate by an amount not more than the molecular mean free path of the carrier gas.

6. The method of claim 1 wherein the features are suitable for use as pixels in a light-emitting device.

7. The method of claim 1, wherein the nozzle block is heated.

8. The method of claim 7, wherein the nozzle block is heated to a temperature higher than the temperature at which physisorbtion of the organic vapor occurs on the nozzle surface.

9. The method of claim 7, wherein the substrate is cooled to a temperature lower than the nozzle block.

10. The method of claim 1, wherein the organic vapor comprises a small molecule organic material.

11. The method of claim 1, wherein the bulk velocity is sufficiently great to provide a substantially unidirectional jet of material.

12. The method of claim 1, wherein the laterally-patterned organic film is fabricated without the use of a mask.

13. The method of claim 1, wherein the nozzle block comprises a two-dimensional array of nozzles.

14. The method of claim 1, wherein the nozzle block and the substrate are moved relative to each other in a lateral direction during the ejection.

15. The method of claim 1, wherein the nozzle block includes a nozzle having a variable aperture.

16. A method of depositing an organic film, comprising:
   providing a heated non-reactive carrier gas transporting an organic vapor; and
   ejecting the heated non-reactive carrier gas transporting an organic vapor through a nozzle block, with a bulk flow velocity at least as great as the thermal velocity of the molecules, onto a cooled substrate, to form an organic film having a pattern;
   wherein the pattern comprises a plurality of laterally-spaced, raised physical features, each physical feature being deposited by a nozzle in the nozzle block.

17. The method of claim 16, wherein the width of each of the features is approximately equal to the width of the nozzle.

18. The method of claim 16, wherein the nozzle is separated from the substrate by an amount on the order of the molecular mean free path of the carrier gas.

19. The method of claim 16, wherein the nozzle is separated from the substrate by an amount not more than the molecular mean free path of the carrier gas.

20. The method of claim 16, wherein each feature covers an area of not more than about 10000 µm$^2$.

21. The method of claim 20 wherein the features are suitable for use as pixels in a light-emitting device.

22. The method of claim 16, wherein the nozzle block is heated.

23. The method of claim 22, wherein the nozzle block is heated to a temperature higher than the temperature at which physisorbtion of the organic vapor occurs on the nozzle surface.

24. The method of claim 22, wherein the substrate is cooled to a temperature lower than the nozzle block.

25. The method of claim 16, wherein the organic vapor comprises a small molecule organic material.

26. The method of claim 16, wherein the bulk velocity is sufficiently great to provide a substantially unidirectional jet of material.

27. The method of claim 16, wherein the laterally-patterned organic film is fabricated without the use of a mask.

28. The method of claim 16, wherein the nozzle block comprises a two-dimensional array of nozzles.

29. The method of claim 16, wherein the nozzle block and the substrate are moved relative to each other in a lateral direction during the ejection.

30. The method of claim 16, wherein the nozzle block includes a nozzle having a variable aperture.

31. The method of claim 16, wherein a region of substrate between adjacent physical features is left substantially uncoated.

32. The method of claim 16, wherein the cross-section of each of the physical features is approximately the same shape as the cross section of a nozzle.

33. The method of claim 16, wherein each physical feature is deposited by a separate nozzle in the nozzle block.

34. The method of claim 16, wherein each nozzle in the nozzle block deposits a plurality of the physical features.

* * * * *